United States Patent
Slafer

(10) Patent No.: US 10,505,268 B2
(45) Date of Patent: Dec. 10, 2019

(54) METHODS AND SYSTEMS FOR FORMING FLEXIBLE MULTILAYER STRUCTURES

(71) Applicant: Microcontinuum, Inc., Cambridge, MA (US)

(72) Inventor: W. Dennis Slafer, Arlington, MA (US)

(73) Assignee: MicroContinuum, Inc., Cambridge, MA (US)

(*) Notice: Subject to any disclaimer, the term of this patent is extended or adjusted under 35 U.S.C. 154(b) by 694 days.

(21) Appl. No.: 14/575,034

(22) Filed: Dec. 18, 2014

(65) Prior Publication Data

US 2015/0102007 A1    Apr. 16, 2015
US 2019/0267162 A9    Aug. 29, 2019

Related U.S. Application Data

(60) Division of application No. 12/270,650, filed on Nov. 13, 2008, now Pat. No. 8,940,117, which is a
(Continued)

(51) Int. Cl.
*H01Q 1/00* (2006.01)
*C25D 7/00* (2006.01)
(Continued)

(52) U.S. Cl.
CPC .............. *H01Q 1/364* (2013.01); *B82Y 10/00* (2013.01); *B82Y 40/00* (2013.01);
(Continued)

(58) Field of Classification Search
CPC ..... B82Y 10/00; B82Y 40/00; C23C 18/1605; C23C 18/165; C25D 5/022; C25D 7/00;
(Continued)

(56) References Cited

U.S. PATENT DOCUMENTS 3,926,402 A    12/1975    Heenan
4,181,217 A    1/1980    Huls et al.
(Continued)

FOREIGN PATENT DOCUMENTS

EP    1093901 A1    4/2001

OTHER PUBLICATIONS international Search Report for corresponding PCT Application No. PCT/US08/83407, 2 pp.
(Continued)

*Primary Examiner* — Linda L Gray
(74) *Attorney, Agent, or Firm* — Cesari and McKenna, LLP

(57) ABSTRACT

Techniques are described for fabricating multilayer structures having arrays of conducting elements or apertures in a conductive grid which can be used to form frequency selective surfaces (FSSs), antenna arrays and the like on flexible substrates. Fabrication techniques can include use of a polymer mask or direct dielectric molding. In embodiments utilizing a polymer mask, a temporary 3D polymeric relief pattern is formed on a substrate and used as a mask or stencil to form the desired pattern elements. In an additive process, the conductive material is deposited over the masked surface. Deposition can be followed by mask removal. In the subtractive process, the conductive layer can be deposited prior to formation of the polymer mask, and the exposed parts of the underlying conductive layer can be etched. Other embodiments utilize dielectric molding in which the molded structure itself becomes an integral and permanent part of the FSS structure.

16 Claims, 31 Drawing Sheets

Related U.S. Application Data continuation-in-part of application No. 11/830,718, filed on Jul. 30, 2007, now Pat. No. 8,535,041, which is a continuation of application No. 11/711,928, filed on Feb. 27, 2007, now Pat. No. 9,039,401.

(60) Provisional application No. 60/987,626, filed on Nov. 13, 2007.

(51) Int. Cl.

| | |
|---|---|
| *C25D 5/00* | (2006.01) |
| *C23C 18/00* | (2006.01) |
| *H01Q 1/36* | (2006.01) |
| *C25D 5/02* | (2006.01) |
| *B82Y 10/00* | (2011.01) |
| *B82Y 40/00* | (2011.01) |
| *G03F 7/00* | (2006.01) |
| *C23C 18/16* | (2006.01) |

(52) U.S. Cl.
CPC ........ *C23C 18/1605* (2013.01); *C23C 18/165* (2013.01); *C25D 5/022* (2013.01); *C25D 7/00* (2013.01); *G03F 7/0002* (2013.01); *Y10T 156/1039* (2015.01)

(58) Field of Classification Search
CPC .. G03F 7/0002; Y10T 156/1039; H01Q 1/364
See application file for complete search history.

(56) References Cited

U.S. PATENT DOCUMENTS

| | | | |
|---|---|---|---|
| 4,362,806 | A | 12/1982 | Whitmore |
| 4,366,235 | A | 12/1982 | Land |
| 4,386,145 | A | 5/1983 | Gilmour |
| 4,478,769 | A | 10/1984 | Pirocone et al. |
| 4,663,274 | A | 5/1987 | Slafer et al. |
| 4,860,023 | A | 8/1989 | Halm |
| 5,075,796 | A | 12/1991 | Schildkraut et al. |
| 5,358,283 | A | 10/1994 | Silva |
| 5,759,455 | A | 6/1998 | Kamitakahara et al. |
| 5,759,468 | A | 6/1998 | Smith et al. |
| 5,948,488 | A | 9/1999 | Marecki et al. |
| 6,015,599 | A | 1/2000 | Keller et al. |
| 6,018,383 | A | 1/2000 | Dunn et al. |
| 6,350,664 | B1 | 2/2002 | Haji et al. |
| 6,375,870 | B1 | 4/2002 | Visovsky et al. |
| 6,395,136 | B1 | 5/2002 | Andersson et al. |
| 6,482,742 | B1 | 11/2002 | Chou |
| 6,540,367 | B1 | 4/2003 | Benson et al. |
| 6,551,410 | B2 | 4/2003 | Crevasse et al. |
| 6,568,931 | B2 | 5/2003 | Fujii et al. |
| 6,696,220 | B2 | 2/2004 | Bailey et al. |
| 6,753,067 | B2 | 6/2004 | Chen et al. |
| 6,788,452 | B2 | 9/2004 | Liang et al. |
| 6,833,177 | B2 | 12/2004 | Chen et al. |
| 6,873,452 | B2 | 3/2005 | Tseng et al. |
| 6,875,384 | B1 | 4/2005 | Whitney |
| 6,906,779 | B2 | 6/2005 | Chan-Park et al. |
| 6,933,098 | B2 | 8/2005 | Chan-Park et al. |
| 6,972,893 | B2 | 12/2005 | Chen et al. |
| 7,005,468 | B2 | 2/2006 | Zang et al. |
| 7,144,942 | B2 | 12/2006 | Zang et al. |
| 7,154,451 | B1 | 12/2006 | Sievenpiper |
| 7,190,315 | B2 | 3/2007 | Waltho |
| 7,261,950 | B2 | 8/2007 | Fleming et al. |
| 7,309,222 | B2 | 12/2007 | Tippmann, Sr. |
| 7,792,644 | B2 | 9/2010 | Kotter et al. |
| 8,071,931 | B2 | 12/2011 | Novack |
| 8,435,373 | B2 | 5/2013 | Slafer |
| 9,039,401 | B2 | 5/2015 | Slafer |
| 2002/0186472 | A1 | 12/2002 | Sloot |
| 2003/0227683 | A1 | 12/2003 | Sewell et al. |
| 2004/0131718 | A1 | 7/2004 | Chou et al. |
| 2004/0175528 | A1 | 9/2004 | Paulson et al. |
| 2004/0219246 | A1 | 11/2004 | Jeans |
| 2005/0112472 | A1 | 5/2005 | Kutch et al. |
| 2005/0133954 | A1 | 6/2005 | Homola |
| 2005/0239935 | A1 | 10/2005 | Kang et al. |
| 2006/0134922 | A1 | 6/2006 | Taussig et al. |
| 2006/0283539 | A1 | 12/2006 | Slafer |
| 2007/0169336 | A1 | 7/2007 | Luch |
| 2007/0171120 | A1 | 7/2007 | Puscasu et al. |

OTHER PUBLICATIONS

Written Opinion for corresponding PCT Application No. PCT/US08/83407, 6 pp. D.

Kolter et el., "Theory and Manufacturing Processes of Solar Nanoantenna Electromagnetic Collectors," Journal of Solar Energy Engineering, vol. 132, 11 pages (2010).

Krishnan, "Design, Fabrication and Characterization of Thin-Film—M-I-M Diodee Rectenna Array," Sr. MS Thesis (2004).

Puscasu et al., "Comparison of Infared Frequency Selective Surfaces Fabricated by Direct-Write Electron-Beam and Bilayer Nanoimprint Lithographies," J. Vac. Sci. Technol., 18:3578-3581 (2000).

International Search Report for corresponding PCT Application No. PCT/US08/83407, 1 pp.

Written Opinion for corresponding PCT Application No. PCT/US08/83407, 6 pp.

Photovoltaic Technologies Beyond the Horizon: Optical Rectenna Solar Cell Report, Feb. 2003, NREL/SR-520-33263.

International Search Report for corresponding PCT Application No. PCT/US07/05151, dated Dec. 17, 2007, 4 pp.

Written Opinion for corresponding PCT Application No. PCT/US07/05151, dated Dec. 17, 2007, 13 pp.

James J. Cowan et al., "The Recording and Replication of Holographic Micropatterns for the Ordering of Photographic Emulsion Grains in Film Systems", J. Imaging Sci, 31, 100-107 (1987).

W.D. Slafer et al, "Investigation of Arrayed Silver Halide Grains", J. Imaging Sci. 31, 117-125 (1987).

V. Walworth, et al., "Thin Layer Coalescence of Silver Halides", J. Imaging Sci., 108-116 (1987).

Sachin Bet, Et al., "Thin film deposition on plastic substrates using silicon nanoparticles and laser nanoforming" Materials Science and Engineering, B. vol. 130, issues 1-3, Jun. 15, 2006, pp. 228-236.

International Search Report for corresponding PCT Application No. PCT/US07/47766, 4 pp.

Written Opinion for corresponding PCT Application No. PCT/US07/47766, 6 pp.

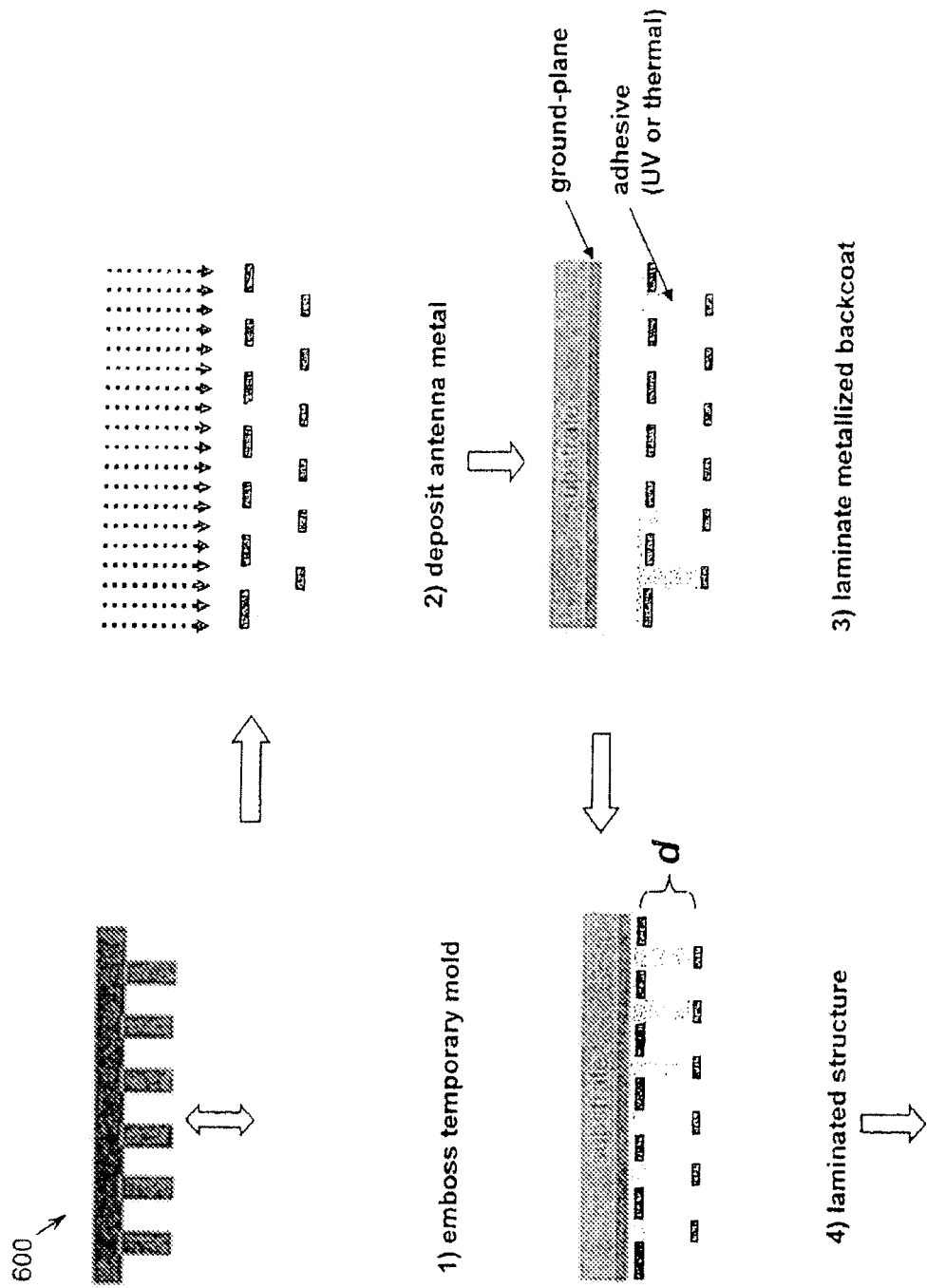

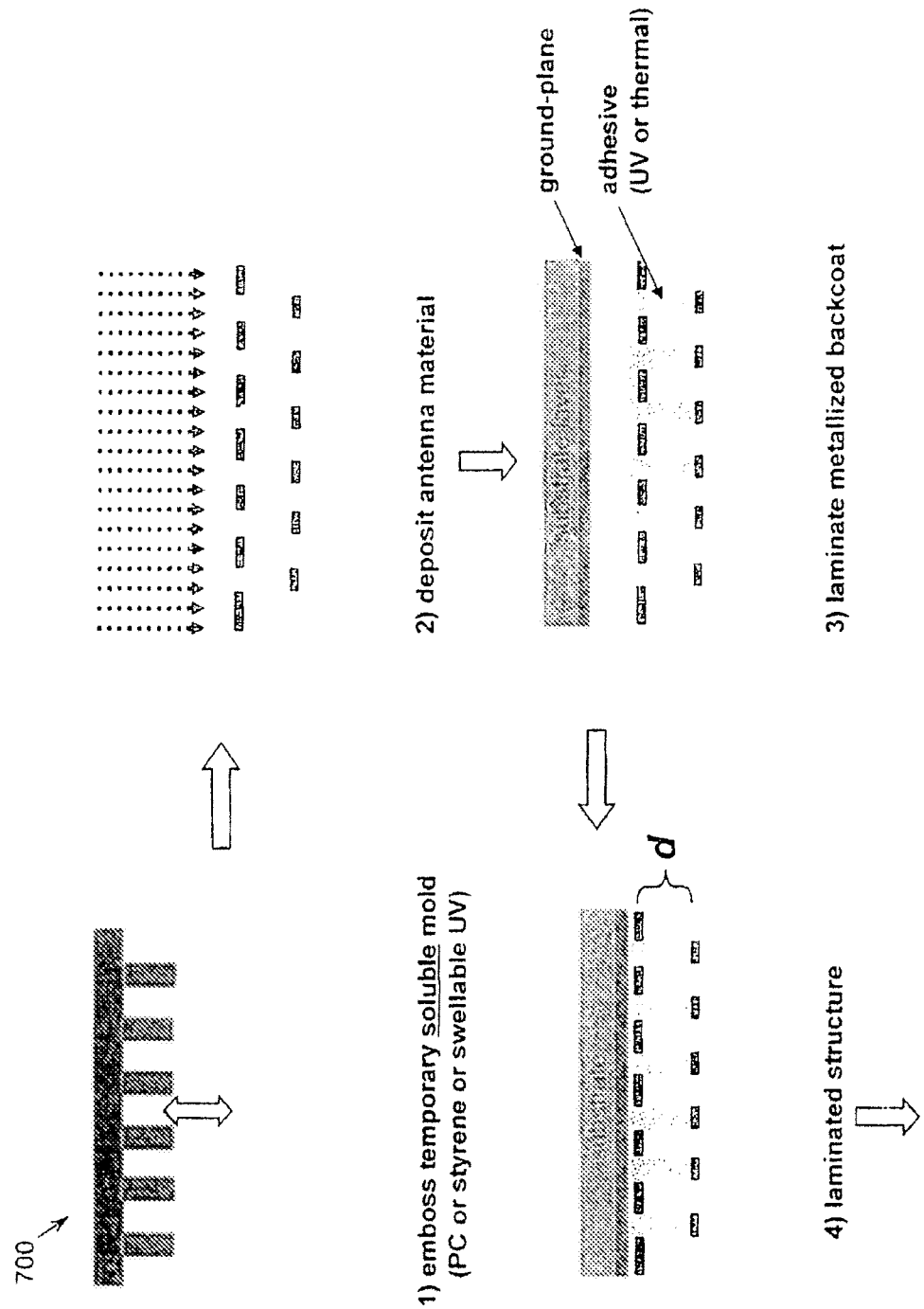

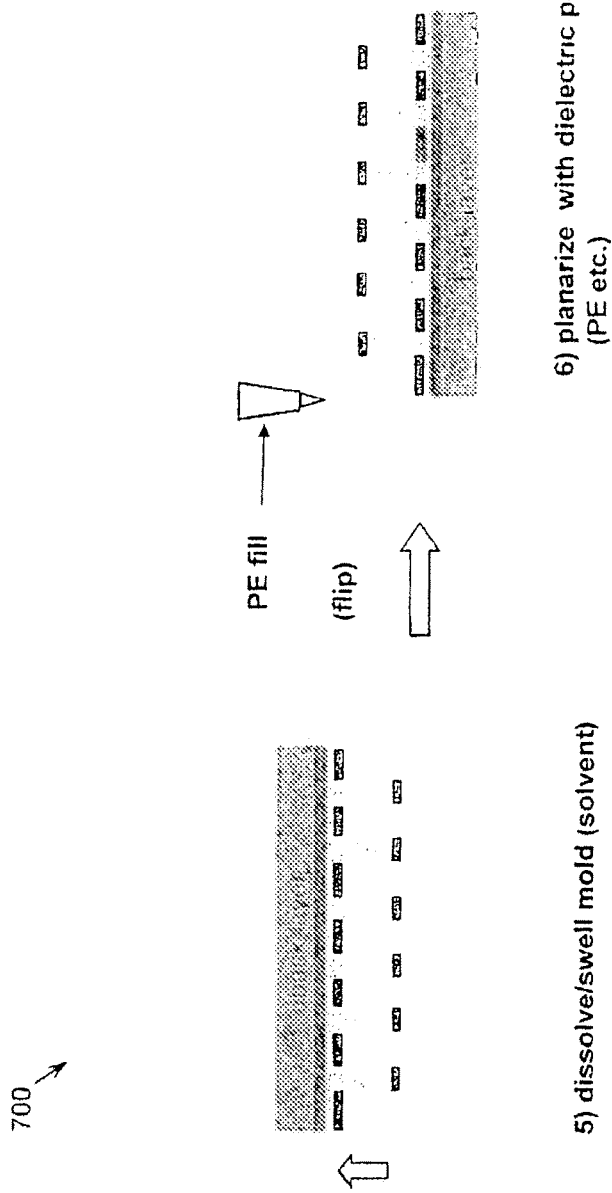

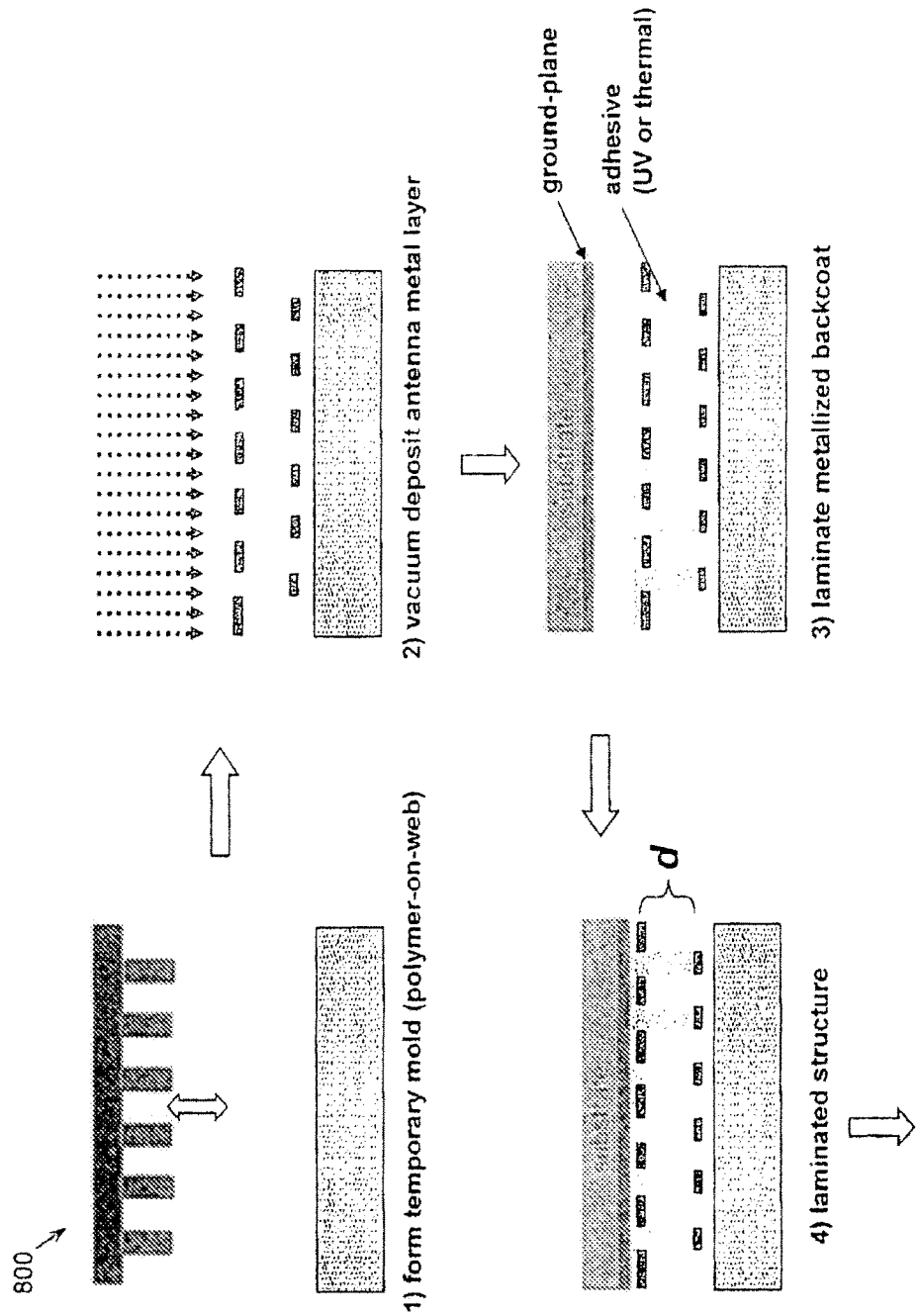

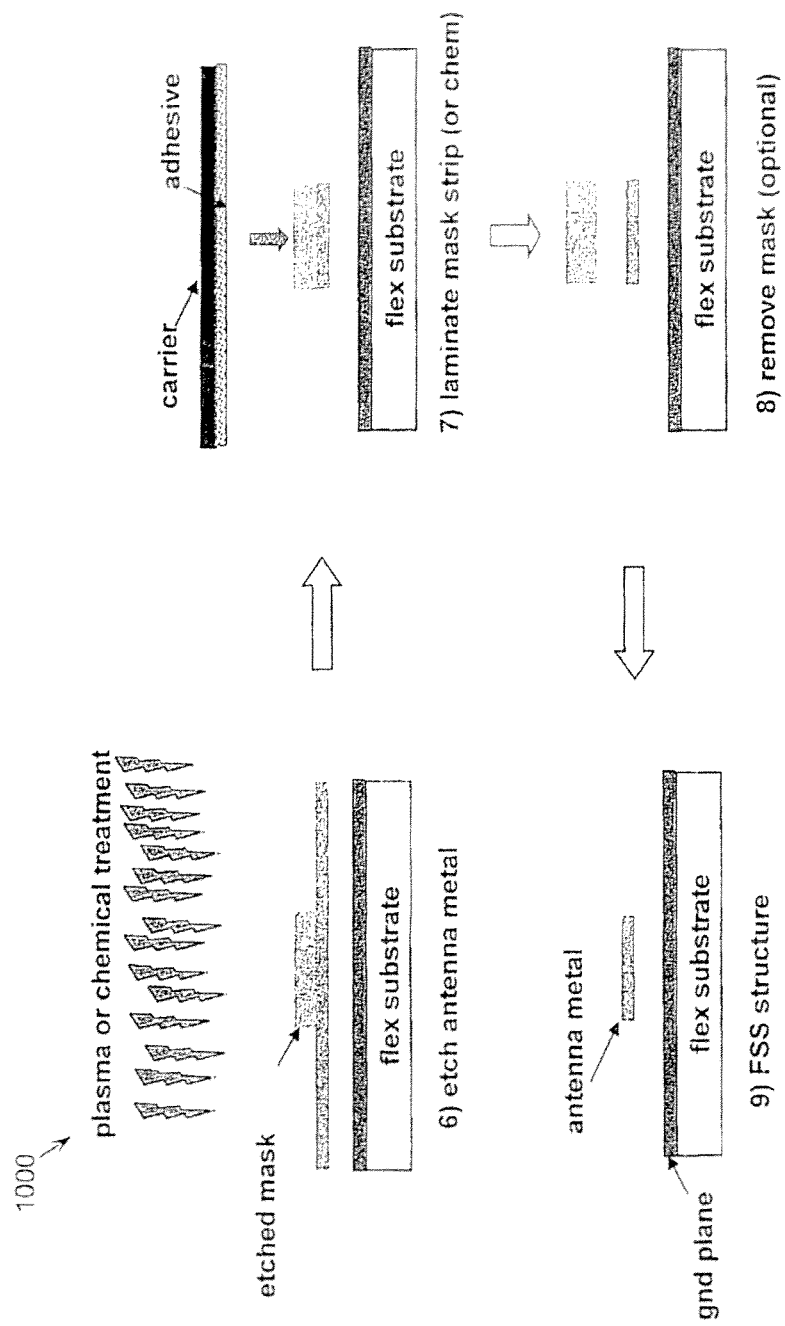

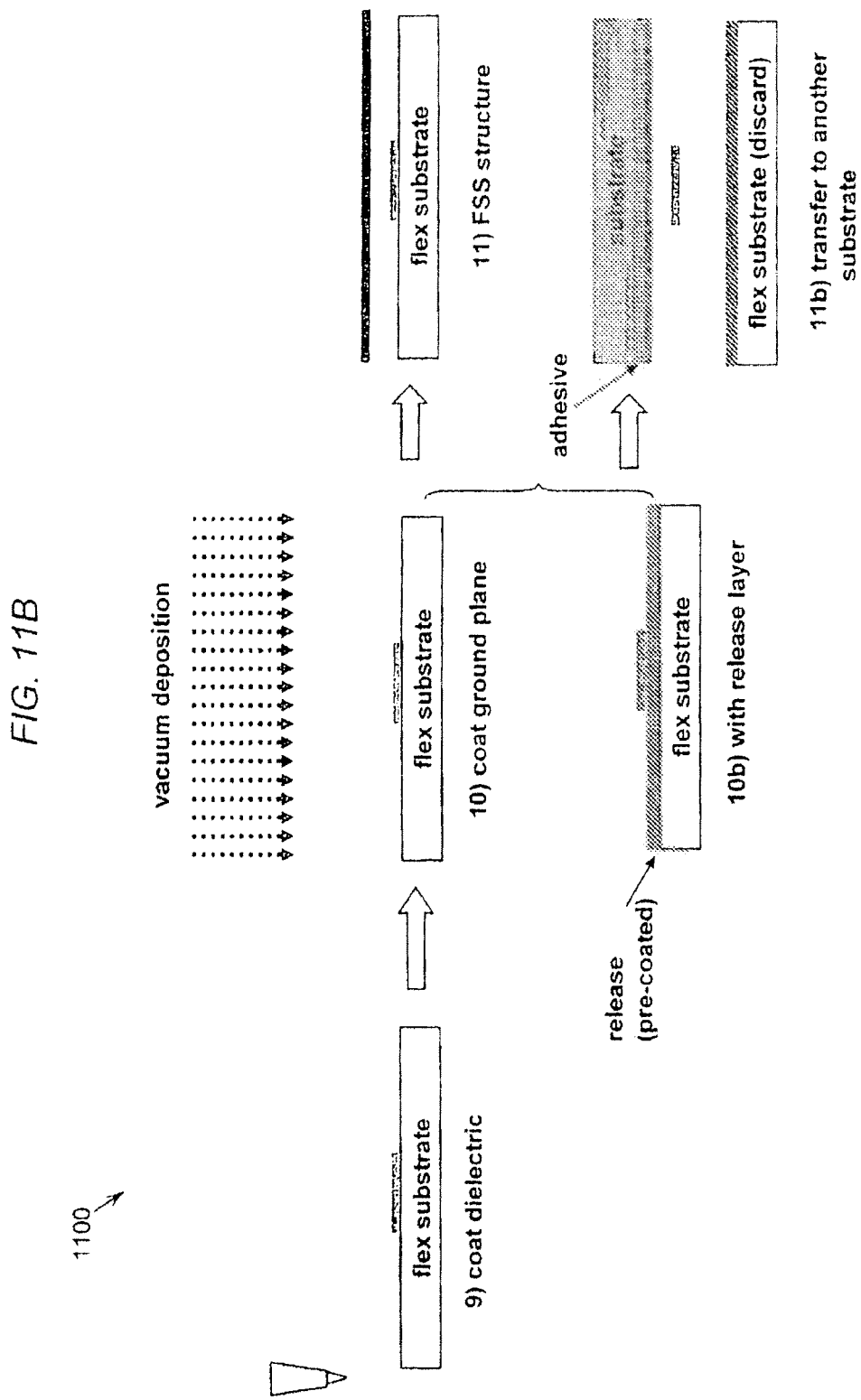

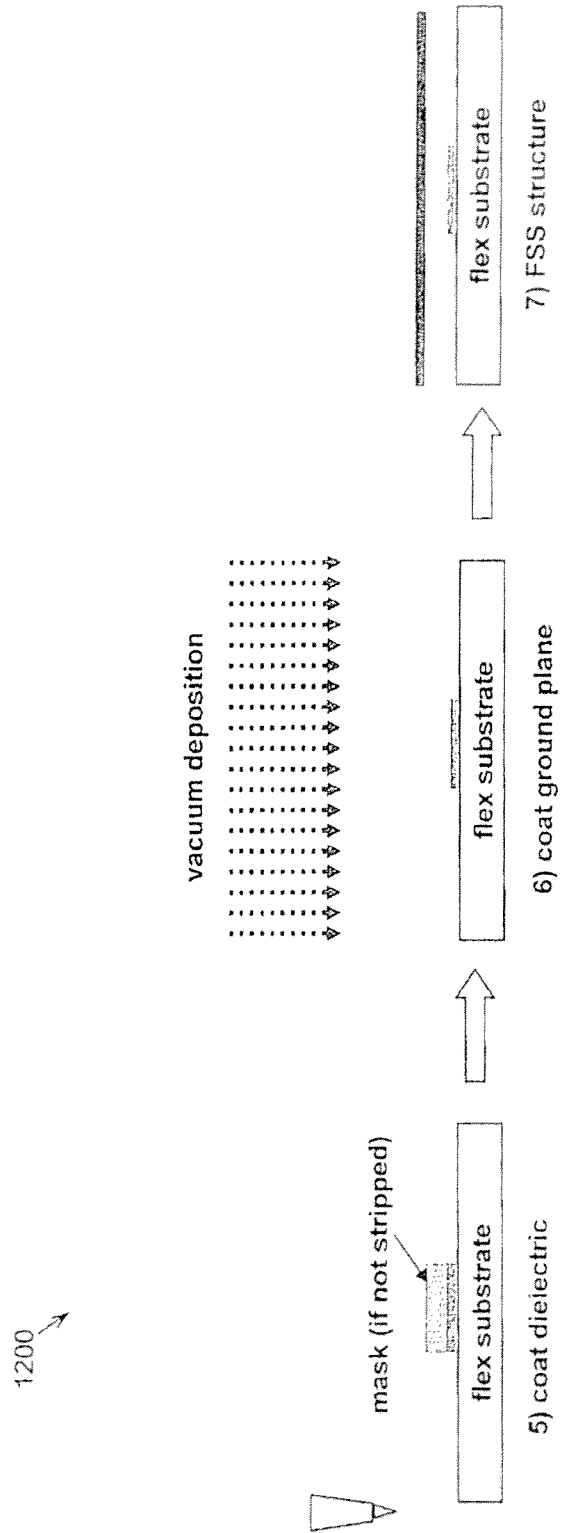

METHODS AND SYSTEMS FOR FORMING FLEXIBLE MULTILAYER STRUCTURES

RELATED APPLICATIONS

The present disclosure is a Divisional of U.S. patent application Ser. No. 12/270,650 entitled "Methods and Systems for Forming Flexible Multilayer Structures" filed Nov. 13, 2008, which is a continuation-in-part of U.S. patent application Ser. No. 11/830,718 entitled "Addressable Flexible Patterns" filed 30 Jul. 2007, and a continuation-in-part of U.S. patent application Ser. No. 11/711,928 entitled "Formation of Pattern Replicating Tools" filed 27 Feb. 2007, and which application claims priority to U.S. Provisional Patent Application No. 60/987,626 filed 13 Nov. 2007 and entitled "Methods and Systems for Forming Flexible Multilayer Structures"; the entire contents of all of which applications are incorporated herein by reference.

This application is also related to co-pending U.S. patent application Ser. No. 11/939,358 filed 13 Nov. 2007 and entitled "Methods, Computer Readable Media, and Graphical User Interfaces for Analysis of Frequency Selective Surfaces," co-pending U.S. patent application Ser. No. 11/939,342 filed on 13 Nov. 2007 and entitled "Structures, Systems and Methods for Harvesting Energy from Electromagnetic Radiation," and U.S. Provisional Patent Application Ser. No. 60/987,630 filed on 13 Nov. 2007 and entitled "Antenna Devices Comprising Flexible Substrates, Related Structures, and Methods of Making and Using the Same"; the entire disclosures of all which applications are incorporated by reference herein in their entireties.

BACKGROUND

The possibility of controlling the electromagnetic (EM)-wave transmission and reflection properties of a surface by patterning it with an appropriate array of conducting elements or apertures in a conductive grid has been well established. Dating from the late 1960s, a number of scientific and technical papers have theoretically modeled and experimentally demonstrated the performance of such structures, often referred to as Frequency Selective Surfaces ("FSS"s). FSS structures can be composed of a single or multiple layers of generally periodic conductive elements and can be designed for customized frequency response, thus the have a broad range of applications throughout the electromagnetic spectrum: they have been used as directional antennas, dichroic beam-splitters, polarizers, A/R (antireflective) and highly reflective surfaces and high- and low-pass spectral filters, etc. To date, many of these applications have involved relatively long (millimeter) wavelengths.

A principal reason for this restriction is that the feature sizes required for an FSS with controlled characteristics at any given wavelength decrease with the wavelength. Therefore, to produce an FSS for infrared (or shorter) wavelength operation, 200 nm and smaller feature sizes are needed and fabrication via electron beam lithography ("EBL"), x-ray lithography or some other ultra-high resolution means is required. These fabrication techniques are generally very slow and expensive. This has limited IR FSSs to small sizes and has severely compromised their utility for many applications (including military asset signature control).

A related device, the rectenna, a combination of rectifier and antenna, has been explored for remote power transmission via radio waves of surveillance and communications vehicles. More recently, rectennas designed for the IR-vis spectral region have been proposed for solar energy collection (conversion efficiencies of 85% have been reported for such devices operating in the RF frequencies range). As with FSS structures, the IR-vis version of this device would require periodic structures with elements having certain dimensions in the range of tens to hundreds of nanometers. For the purposes of this discussion, the term "FSS" shall also be understood to include in whole or in part antennas, rectennas and similar structures.

The conventional fabrication schemes used to produce such devices generally use the methods of semiconductor lithography to create patterns based on optical exposure of photoresist layers in a batch (discrete unit) mode. This approach has also been extended to flexible substrates under a more constrained set of conditions, but in general limited to much larger scale features. While the batch semiconductor methods are well suited for ultra-high resolution/high-density devices, they are less than optimal for use with devices requiring large flexible substrates, high throughputs and/or utilize very low cost manufacturing. Production of the precision etch masks used in semiconductor lithography typically requires a complex multi-step process which includes very uniform spin coating of a solvent-based resist, careful pre-baking, optical mask exposure, resist developing (wet or dry), rinsing and drying of the resist prior to vacuum deposition or etching, after which the mask is removed, typically by a wet stripping or etching, rinsed and dried. As features become smaller and smaller, the required shorter wavelength exposure sources and mask technology become much more complex and extremely expensive.

Nano- (and micro-) imprint (or soft) lithography ("NIL"), as generally practiced, offers a partial solution to the complexities, and therefore expense, associated with conventional batch processed photo-lithography. In this approach etch masks are produced by embossing and etching soft polymer material in batch mode. While this can require the use of expensive ultra-high-resolution lithography equipment to produce tools/stampers, these tools can be used many times, thereby allowing their high cost to be amortized over many product units. There are currently a number industrial research laboratories and academic institutions that are pursuing such techniques. However, current NIL etch pattern mask production techniques are limited in their ability to achieve low cost and relatively high throughput production volumes/sizes because they are generally being developed for the semiconductor industry, which is limited in terms of maximum substrate size and throughput.

In order to bring the advantages of semiconductor mask processing and imprint lithography to the large scale production of FSS and similar devices and structures, new techniques and methods are needed, particularly those that can be designed ultimately for compatibility with the methods of roll-to-roll manufacturing. Due to the ability to inexpensively mass-produce such structures that were hitherto prohibitively expensive in large areas through the use of continuous roll-to-roll manufacturing, this material will, for the first time, offer a cost-effective means to produce such structures for use in numerous applications: solar energy, flexible electronics, military homeland security applications (tagging, tracking and locating, camouflaging, etc.)

SUMMARY

Embodiments of the present disclosure are directed to techniques for forming frequency selective surfaces ("FSS"), antennas and such structures comprising one or more additional layers on flexible substrates, e.g., those used with or suitable for roll-to-roll ("R2R") processing/manufacturing.

FSS structures according to the present disclosure can be configured as periodic structures, e.g., arrays of antennas and may be implemented with rectifiers (e.g., diodes) to form so-called "rectennas". Such antennas and rectennas can be suitable for receiving electromagnetic radiation, e.g., in the terahertz (THz) and other frequency regimes, including rectennas with appropriately sized elements to be able to receive IR and visible radiation, and with rectifiers (metal-insulator-metal tunneling diodes and the like) and related circuitry (impedance matching elements, etc.) suitably able to operate in this regime (e.g., 30 THZ and higher).

Aspects and embodiments of the present disclosure can provide various advantages compared to prior art techniques. For example, embodiments can provide for the construction of FSS structures, including ones comprising a multiplicity of layers, including antenna arrays for solar rectennas, on flexible substrates. For the purposes of simplicity, the formation of more complex structures will be represented by the use of a planar metal ("ground plane") layer, although by means of the embodiments described herein, this layer can also represent more complex and/or patterned layers. Embodiments of such multi-layers structures also include the formation of one or more separation (dielectric spacer) layers of a precise thickness to create precision separations between various layers, or to provide a desired physical property resulting from this the thickness and/or physical characteristics of said layer(s). For example, it is known that the inclusion of a conductive layer (ground plane) at a precise distance from the plane of the patterned conductor with appropriate dielectric spacing material can be used to optimize the spectral response of the FSS structure. Additionally, exemplary embodiments can provide improved methods for forming copies of master templates with high aspect ratios and/or high surface areas that may be otherwise difficult to replicate. Such methods may be applicable to the fabrication of tools used for large-scale production of FSS and other structures utilizing 3D patterns that are otherwise difficult to replicate.

Embodiments of the present disclosure can be implemented in hardware, software, firmware, or any combinations of such, and over one or more networks and/or communications links.

Other features and advantages of the present disclosure will be understood upon reading and understanding the detailed description of exemplary embodiments, described herein, in conjunction with reference to the drawings.

BRIEF DESCRIPTION OF THE DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 7 includes FIGS. 7A-7B, which depict a schematic view of a process that is similar to process of FIG. 6, except temporary mold is made from soluble material that can de removed by solvent, in accordance with a further embodiment of the present disclosure;

Figure 1:
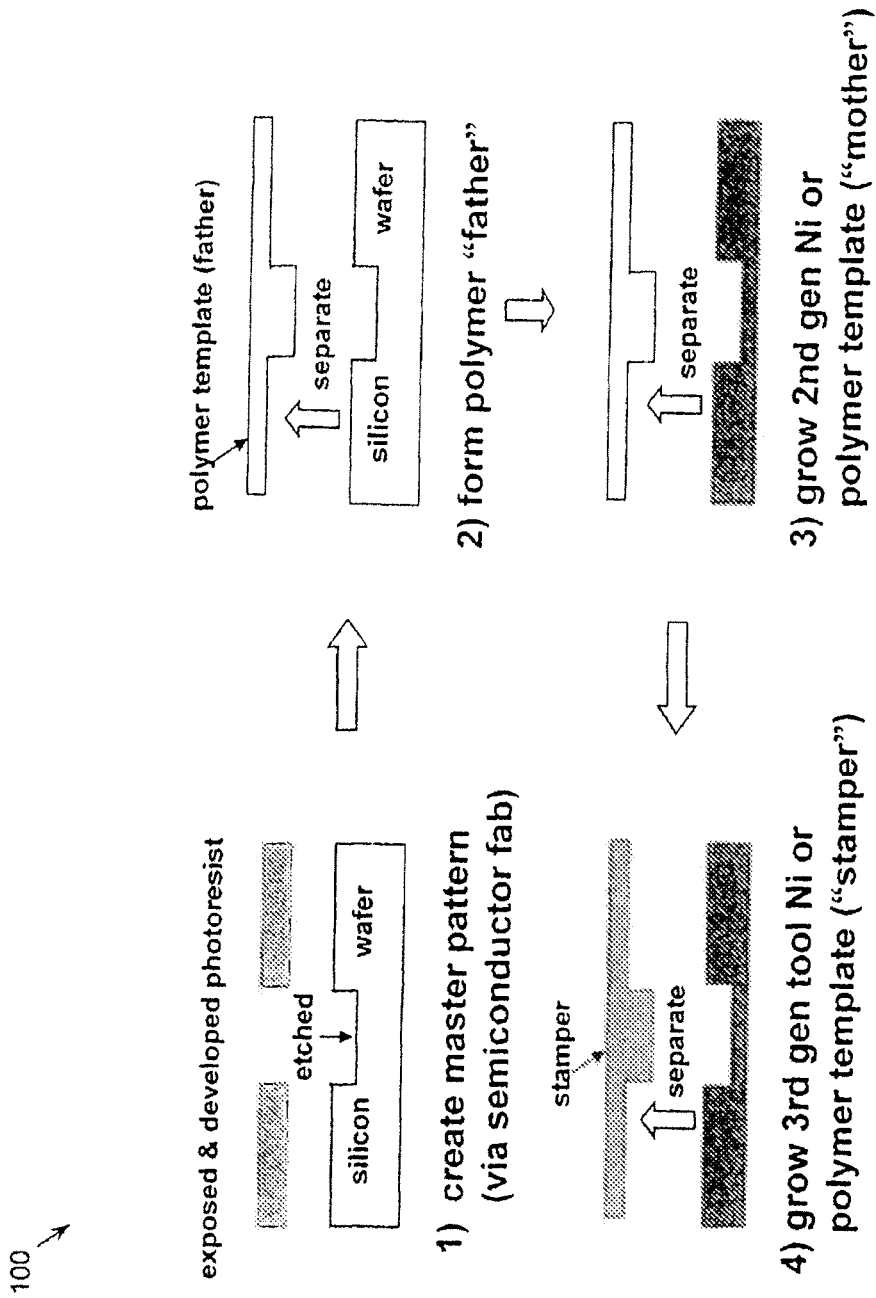
FIG. 1. depicts a schematic view of a process for creating the master template and multiple generations from the master template in accordance with embodiments of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In general terms, the present disclosure describes various techniques (including methods and apparatus) for forming FSS and similar structures with features having features down to submicron dimensions. These techniques can utilize in situ polymer mask formation and dielectric polymer film molding. The techniques can be extended to large scale fabrication of devices based on such structures using roll-to-roll ("R2R") manufacturing techniques, such as those previously disclosed by the Assignee of the present disclosure in U.S. patent application Ser. No. 11/471,223 filed on 20 Jun. 2006, claiming priority to U.S. Provisional Patent Application Ser. No. 60/692,078 filed 20 Jun. 2005 and the formation of pattern replicating tools as disclosed in U.S. patent application Ser. No. 11/711,928 filed on Feb. 27, 2007 and claiming priority to U.S. Provisional Patent Application Ser. No. 60/777,203 filed on 27 Feb. 2006 and U.S. Provisional Patent Application Ser. No. 60/777,138 filed on 27 Feb. 2006; the entire contents of all of which applications are incorporated herein by reference.

Fabrication Schemes

In general, FSS structures comprise a surface having an appropriate array of conducting patches or apertures in a conductive grid, and may also include an electrically conductive ground plane or other such layer and an insulating dielectric/spacer layer separating the conductive layers. The conductive pattern element layer may be a periodic structure, such as an array of antenna loops, crosses, circles, spirals, holes, posts, or any repeating structure appropriate for the particular application. For the current examples, we will use for the case an array of metallic antenna loops, but it should be noted that the methods described herein also apply to most other geometric elements of periodic as well as aperiodic structural elements.

Top Down & Bottom Up Construction

Methods for forming these structures can be generally divided into two process schemes for ease of classification and explanation. In the following explanations and descriptions, the "top" of the structure is defined as the first surface, i.e., the surface on which incoming radiation is first incident, and for FSS-like structures this is generally (but not always) the patterned conductive layer. This structure may contain a ground plane, which is separated from the pattern layer by a non-conducting layer, referred to variously as the dielectric, spacer, or separation layer. The function of the this layer is not only to separate the two conductive layers, but can also function as a tuned spacer layer, such as having ¼-wavelength, e.g., in optical/EM radiation path length, or other spacing as required by the structure. The conductive ground plane in this description is therefore the "bottom" layer, although it should be noted that there may additional layers under or connected to the ground plane, such as a supporting film, an adhesive layer, read out integrated circuitry ("ROIC"), diode switches, thin film transistors, general electrical elements, etc. When combined with a rectifying layer, the FSS or antenna structures can be configured and arranged as solar rectennas or the like, e.g., for harvesting solar or other radiation.

Some schemes of construction described herein will be referred to as "bottom up" methods, in which the structure is constructed sequentially from the ground plane (bottom) to the patterned conductor (top), and others as "top down", in which the structure is constructed sequentially from the patterned conductor (top) to the ground plane (bottom).

It should be noted that sequential use of one or more of any of the above fabrication techniques in order to build up a multi-layer or 3 dimensional type structure is also within the scope of the present disclosure. This could, for example, allow the integration of additional electronic or interconnecting elements to FSS or antenna structures, including but not limited to thin-film transistors (TFTs), rectifiers, resistors, capacitors, inductors and the like in any combination and in the multiplicity of layers as required to form the desired structure.

Polymer Mask Vs. Dielectric Molding

The various methods used to fabricate any particular structural or patterned layer may be further classified as processes/methods predominantly using a polymer mask or dielectric molding.

In embodiments utilizing a polymer mask, a temporary 3D polymeric relief pattern is formed on a substrate and used as a mask or stencil to form, in combination with other material deposition ("additive") or removal ("subtractive") steps, the desired elements or layers. This pattern, which can be made by such techniques as previously disclosed by MicroContinuum in U.S. patent application Ser. No. 11/471,223 filed on Jun. 20, 2006, claiming priority to U.S. Patent Application Ser. No. 60/692,078 filed Jun. 20, 2005 and are incorporated herein, can be used to produce a patterned conductive (or non-conductive) layer. After the 3D relief pattern is imprinted (molded) from a template or tool, as described below, any polymeric residue ("scum") that remains at the bottom of the pattern after the molding process can be removed, e.g., by plasma (or chemical) etching, to expose the layer underlying the polymer pattern.

In the additive process, the conductive material is deposited over the masked surface, either by vacuum techniques, solution coating, or by any appropriate means known to the art. Deposition can be followed by removal of the mask (and excess deposited material) by a stripping or lift-off process, which leaves behind the desired pattern (i.e., that formed from the material deposited through the openings at the bottom of the mask/stencil).

In the subtractive process, the conductive layer (or layers) to be patterned is deposited prior to formation of the polymer mask, and after removal of any residue in the bottom of the pattern, the exposed parts of the underlying conductive layer are etched, either by plasma or chemical means. At this point the mask can be removed, or, if not interfering with the subsequent operation of the structure, can be left in place. Any remaining parts of the FSS or antenna structure can now be completed. For example, the coating of an electrically insulating (dielectric) spacer layer, followed by the deposition of a continuous electrically conductive ground plane layer.

It should be noted that more complex multi-layer (3D) structures, the same or alternative processes described herein can be built upon the underlying planar or patterned layers, such as but not limited to the application of an interlayer over said underlying structure, whereupon any of such processes can be repeated.

In addition to the polymer mask process described above, the second process for making FSS and similar structures, dielectric molding, is used and similarly utilizes imprinting/molding techniques to form a 3D pattern, but differs from these mask methods in that the pattern does not necessarily serve as a temporary mask for subtractive or additive processing, but rather the molded structure itself (or a secondary structure made from it) becomes an integral and permanent part of the FSS structure. A suitable dielectric molding process is described in detail in the co-pending application U.S. Provisional Patent Application Ser. No. 60/987,630 filed on 13 Nov. 2007 and entitled "Antenna Devices Comprising Flexible Substrates, Related Structures, and Methods of Making and Using the Same."

The molding process can use a particular type of binary template the pattern depth of which can be designed to form a spatial separation in the dielectric (spacer) material between two layers, such as the patterned and ground planes. The dielectric material is processed in the form of a film into one surface of which is impressed a template pattern (patterning tool) complementary to that of the desired pattern. A first conductive coating is then formed such that, with additional processing as needed, the two levels of the binary structure formed by the tool are electrically isolated (either spatially or by selective removal of one of the layers). Subsequently, the depressions formed by the tool may be filled in with a dielectric material (to planarize the structure as necessary), or left as "air gaps", then the second electrically conductive layer is formed, either by various deposition means or lamination of another film carrying this layer.

Structure and Materials

Regardless of how the structure is constructed, it may also include a support and/or protective layers, particularly if the composite film comprising the overall structure is thin or fragile. The support layer can be a polymer film such as polyethylene (PE), polyethylene terephthalate (PET, or "Mylar®"), or PEN, polyimide ("Kapton®"), polycarbonate, or any other suitable flexible support. The conductive layers (ground plane and patterned conductors) are typically metals such as gold, silver, copper, aluminum, manganese, titanium, etc., but can also include alloys or even transparent conductive materials, such as indium tin oxide ("ITO"), etc. The conductivity and thickness of the ground plane and the patterned layers may be the same or different, depending on the requirements of the structure, as described in the theoretical model of such devices described in the co-pending U.S. patent application Ser. No. 11/939,358 filed 13 Nov. 2007 and entitled "Methods, Computer Readable Media, and Graphical User Interfaces for Analysis of Frequency Selective Surfaces." For example, the ground plane may require a higher conductivity than the patterned layer, and may therefore be of different materials and/or thicknesses.

The conductive layers may be deposited by vacuum process (sputtering, e-beam, thermal evaporation, ion beam, CVD, etc.), by electroless deposition or electroplating, or by solution coating or ink jet printing, as well as any other means and techniques also know to the art.

The dielectric/spacer layer is typically an electrically insulating material, which may comprise polymers, inorganic materials, composites and ceramics, nanoparticles and nanoparticles in a polymer binder, etc. Where this layer is an inorganic oxide, etc., it may also be deposited by vacuum means (e.g., sputtering, thermal, e-beam, CVD, etc); however, for some structures, such as far IR devices, the thickness of this layer may be in the micron regime, and the vacuum deposition of some materials, such as inorganic oxides, in this thickness range can be very slow, expensive, with the further problem of applying a considerable thermal load to the substrate. Therefore an additional method by which a polymeric separation layer can be applied for this type of structure is by the so-called polymer multi layer ("PML") approach used to produce thin-film capacitors, barrier layers, and the like, in which an organic monomer material is introduced into a vacuum chamber, whereupon it condenses on the film to be coated, followed by passage through an in vacuo curing zone in which radiation from an e-beam or UV source results in the cross-linking of the deposited material. This process is characteristically uniform pinhole free, and can be applied at relatively high coating speeds.

Dielectric/Spaced Layer

The separation layer can be polymeric, such as polyethylene, acrylic PMMA) or other type of polymeric material, or inorganic, such as an oxide or oxide mixture, or a composite blend, such as nanoinorganic particulate in an organic binder, where the optical and electrical properties of this layer is chosen to have optimal properties in the spectral region of interest (e.g., using polyethylene when high transmissivity required in certain IR bands). Materials such as polyethylene dispersions or emulsion (such as made by Michelman Inc., Cincinnati Ohio) can be used for the dielectric layer, or as a filler in molded PE films, and have the advantage of being easily coated from aqueous solution and being very inexpensive materials. The dielectric layer can also be a radiation- or thermally-curable material, such as a UV or e-beam (etc.) cured polymer, or a composite (nanoparticles in organic binder, where the binder can also be radiation cured). In this latter case it is important to use suitably small particles, such as in the nano-scale regime, in order not to form a surface with roughness (due to the particles) that interferes with the required flatness of the overlying pattern layer.

The periodic layer is now formed on the top surface of the separation layer. This is accomplished by the format on of the three-dimensional polymer relief pattern on the separation layer using a template having a pattern that is geometrically complementary to the desired pattern. The template is used to form the desired 3D relief pattern into the polymeric layer that is disposed over the separation layer by pressing the template against the polymeric layer while the latter is in a softened or liquid state, where numerous techniques are well known to the art.

This can be accomplished by the use of a radiation curable liquid, such as a UV activated material, in which the liquid is exposed to radiation that causes it to solidify while in simultaneous contact with the template and the separation layer. In another embodiment, a polymeric layer such as poly methyl methacrylate ("PMMA") can be coated (typically from solvent or aqueous solution), dried, then patterned using the template with sufficient heating to cause the polymer to be above is softening temperature (Tg).

In yet another embodiment, a fluid or fluid mixture can be used to soften the polymeric layer, for example coating and drying a solution of CAB (cellulose acetate butyrate), then swelling with a solvent blend of acetone and toluene or other solvent(s), where the composition of the fluid may consist of a solvent (or solvents) that soften the polymer plus additional diluents to moderate the rate and depth, etc, of polymer swelling. In all of these various embodiments for molding the polymer layer, the template is typically kept in contact with the polymer until the polymer is reasonably re-solidified prior to separating the tool such that polymer relaxation or flow is minimized, thereby retaining the correct shape.

The 3D polymer pattern thus formed is then used as a "mask" or "stencil" to selectively apply another material over the mask layer or remove a material that underlies the mask layer. As previously described, these processes can be referred to as additive and subtractive processing, respectively. Prior to either, however, it may be necessary to remove any residual polymer from the lowest part of the 3D relief pattern (i.e., that part closest to the separation layer) that remains in the pattern. This is often referred to as a residue or "scum" layer in the art, and may be removed by chemical or plasma etching. The amount of residual polymer left in the bottom of the pattern can also be minimized by judicious use of mask-forming and substrate materials whose surface tensions allow de-wetting of the mask (mold) polymer and the separation layer during molding, such that the polymer layer retracts from the areas where that polymer is sufficiently thin to allow this de-wetting. This results in the elimination or minimization of the subsequent residue etch requirements, thereby reducing the processing requirements and process costs.

In the case of the additive process, the metal comprising the FSS conductive elements is deposited over the (etched) mask, either by vacuum deposition, solution coating or such technique. The FSS pattern itself is formed upon removal of the mask (with its overlying excess deposited material), a step that is known as "lift-off". This may be accomplished by chemically stripping or mechanical stripping (such as with adhesive) the excess polymer/overcoat material.

In the subtractive case, the metal layer to be patterned is deposited over the underlying layer prior to the formation of the molded mask layer. It should be noted that to achieve the same pattern that is formed in the additive case, the template must be "reversed", that is, it must be a copy (second generation) relative to the additive template, since in the subtractive case the material to be removed is complementary to the material that is removed in the additive case.

It may be useful in subtractive processing to deposit a "stop" layer under the layer to be etched, to ensure that the etch process does not continue into the underlying structure. However, the etch process for organic/inorganic and metallic materials is sufficiently different that a stop layer in this case is typically not necessary.

The final step for the subtractive process is, as in the additive case, typically the removal of the "used" polymer mask. However, in certain cases, such as some FSS structures, this may not be necessary, since the small amount of remaining polymer mask layer (typically submicron, depending on the polymer) may generally not interfere with the device performance. In addition, the polymer mask material can be chosen to have minimal absorption or reflection of the incident radiation, thereby further minimizing its effect if left in place.

Further, the intact mask, because it covers the desired material (i.e., that not etched), can beneficially act as a protective overcoat for the patterned layer, and it may further be desirable to apply an overcoat to the whole FSS surface to further enhance its durability. This is preferably kept thin or of such a material so as to minimize absorption/reflection of incident radiation. In addition, for FSS devices that operate in the mid to far IR region, a polyethylene dispersion or emulsion (such as made by Michelman Inc, Cincinnati Ohio) may be advantageous in this application, since polyethylene has low absorbance in this optical region relative to most other polymers. In addition, inorganic layers may be vacuum (or solution) deposited over the FSS pattern as a protective or anti-reflection, etc. layer.

Other Structural Elements

Additional layers may be added to support, protect, or further enhance the performance of the FSS structure, including hard coats, a carrier/support film, an anti-reflection surface, etc. In order to further expand the capabilities of such structures, electronic circuitry can be incorporated such that the device properties may be altered ("active surfaces"), or other functionality may be achieved. For example, an FSS in the form of an antenna may be combined with a rectifying element ("rectenna", ref: U.S. application Ser. No. 11/638, 042 to Pascasu et al. and entitled "Thin Film Emitter-Absorber Apparatus and Methods"; and Puscasu, et al., "Comparison of infrared frequency selective surfaces fabricated by direct-write electron-beam and bilayer nanoimprint lithographies" J. Vac. Sci. Technol. B 186, November/December 2000) to form an energy harvesting surface; see also co-pending U.S. patent application Ser. No. 11/939,342 filed on 13 Nov. 2007 and entitled "Structures, Systems and Methods for Harvesting Energy from Electromagnetic Radiation." Such devices can require the addition of a rectifying element, such as Schottky diode or MIM tunneling diode (ref: Krishnan, S. "Design, Fabrication and Characterization of Thin-Film M-I-M Diodes for Rectenna Array" Sr. MS thesis (USF) May 26, 2004, Photovoltaic Technologies Beyond the Horizon: Optical Rectenna Solar Cell Report, February 2003, NREL/SR-520-33263.

Formation of Template & Replication Tools

The 3D template that will ultimately generate the FSS pattern layer may be made by any of several techniques known to the art of semiconductor manufacturing. For example, a template may consist of a silicon wafer or glass plate in which the relief pattern, in either positive or negative relief, has been formed by using one or more of the following techniques: direct electron-beam writing, laser writing, holographic interferometry, plasma or wet etching, or other lithographic techniques established for forming such features. The finished template may have the desired pattern directly formed in the substrate (e.g., silicon, glass, etc.), or as a pattern in photoresist coated on the substrate. For devices with features in the nano-scale regime, a preferred method of writing uses an electron beam or focused ion beam, such as carried out by MEMS-Exchange (Washington, D.C.) and others, due to their ability to form very fine features.

Such original ("master") templates are generally not directly useful for the pattern molding process, since they are typically brittle or are formed on brittle substrates (such as glass or Si), or are intrinsically fragile (such as photoresist), and often very expensive. Thus it can be preferable to make durable replicas ("tools") from the master template, e.g., as described in Applicant's co-owned U.S. patent application Ser. No. 11/711,928 entitled "Formation of Pattern Replicating Tools" filed 27 Feb. 2007. This can be done by means of Ni electroforming, radiation (UV, e-beam) curing, or thermal processing. These processes are capable of create sufficiently accurate replicas with features down to the nm regime and are useful for production runs of various lengths, depending on the exact nature of the tool. Furthermore, tools having positive or negative relief with respect to the original template can be readily formed by making a second generation copy of the original copy, a process that can be carried out in such a way as to accurately preserve the fidelity of the original template features, as is well known to the field of CD and DVD production.

Tool Formation Problems

Tools used in certain FSS fabrication schemes, particularly those used in the dielectric molding method, where the depth of the tool pattern is equivalent to the distance of separation between two conductive layers, etc., can include high aspect ratio and narrow features. For example, for an FSS structure using square loop antenna elements designed to operate in the mid to far IR region. See co-pending U.S. patent application Ser. No. 11/939,342 filed on 13 Nov. 2007 and entitled "Structures, Systems and Methods for Harvesting Energy from Electromagnetic Radiation," and U.S. Provisional Patent Application Ser. No. 60/987,630 filed on 13 Nov. 2007 and entitled "Antenna Devices Comprising Flexible Substrates, Related Structures, and Methods of Making and Using the Same."

Ridges (or trenches in the complementary tooling) can have heights (or trench depths) of, for example, 1,500 nm and widths of 200 nm, thus giving an aspect ratio of >7:1. Given the very straight walls (characteristic of the etching process by which the master template is formed) and the large surface area of such patterns, to "grow" a durable molding tool from the original master pattern (etched Si, etc.) direct plating of Ni (electroformed or by electroless deposition) will likely lock the Ni tool and rigid Si wafer together, making it impossible or difficult to separate without damage to one or both parts. In addition, metal plating of such high aspect ratio structures can also be problematic, since the "seed layer" used to initiate either plating process may not be deposited uniformly and result in a great deal of artifacts in the generated tools.

It has also been observed that forming polymer replicas (UV or e-beam crosslinked) of such high aspect ratio and/or high surface area patterns can also present problems, resulting from trapped air, pattern distortion during separation, or static attraction and contact of adjacent thin walls to one another after separation. Furthermore, the use of even very thin release layers on the template can significantly change the critical dimensions, particularly if the release coat is formed non-uniformly or of such a thickness that the resultant copy thereby has the wrong critical dimensions, or that the critical replica dimensions change over time as the release layer becomes thinner or degrades with usage (as well as losing its release properties) Furthermore, release layers can contaminate the replica that is formed.

It has been further observed that attempts to repeatedly replicate such templates using crosslinked (UV/e-beam) polymers frequently result in "tear off" or clogging of the template by the polymer. Because these materials are, in their crosslinked form, very insoluble, it is often not possible to clean the tool, particularly with such a high aspect ratio. Processes such as ultrasonic and plasma cleaning are either unsuccessful in returning the tool to original quality (as required to make high quality tooling or replicas), or take very long times and are thus not cost effective solutions.

Therefore embodiments/aspects of the present disclosure can provide advantages relative to the prior art including improved methods for forming copies of master templates with high aspect ratios and/or high surface areas that may be otherwise difficult to replicate. Such methods may be applicable to the fabrication of tools used for large-scale production of FSS and other structures utilizing 3D patterns that are difficult to replicate.

Polyethylene (PE) "tools", for use as intermediate (sub-) masters or short-run usage, have been formed directly from high aspect ratio and/or high surface area Si master templates. Compared to UV polymer and Ni replication of these templates, the thermally molded PE films have very low adhesion to silicon templates, as well as to crosslinked polymer and Ni templates. These may be formed by placing a PE film against a template, placing another film (such as polycarbonate of PET, etc) over the PE film, and applying heat and pressure from a heated platen to the these layers and template. The template may be supported on the backside by a silicone rubber insulator (on a rigid support surface) to minimize heat loss and offer compliance to any non-uniformities in the underlying support surface. In addition, even very minor non-uniformities in the heated platen surface, the template, or the films between the template and the platen have been found to result in areas of poor pattern replication. This is corrected by using one or more layers of a thermally compliant AND moldable interlayer between the heated platen surface and the PE film that is being replicated. A very good material for this compliant layer is also PE, where one or up to 10 layers of 4 mil thick PE film has been used to "absorb" any surface non-uniformities during thermal replication of the template. Thus the greater the "amplitude" of the non-uniformity (which could include point defects or slight warpage of the substrate surface, etc), the thicker the layer(s) of PE that are required for compensation.

One drawback to the use of PE films for pattern replication is the tendency of such films to either curl or to physically distort under relatively tension (low elastic modulus). This has been solved by interposing a film of polycarbonate film between the sheet(s) of PE film in contact with the template and compensation layers. The patterned PE film adheres to the PC film during the molding process, which having a much higher modulus can be handled without distortion as well as to cause the patterned PE film to lie relatively flat.

It is also noted that some commercially available PE films for the packaging industry available with a "heat seal" coating on one (or both) sides. The single-sided heat seal PE films have been found useful for forming permanent thick compensation layers, as well as for building up the intrinsic thickness of thinner PE films.

Single or multiple layers of PE film (from 0.3 to 30 mils) can be thusly used to form PE replicas or to form the compensation layers. In addition, use of a first thin PE film of high quality, such as produced by Fresnel Technologies Inc (Fort Worth, Tex.), in contact with the template, with additional layers of PE as necessary to provide sufficient thickness for deeper patterns, has been found to produce a very high quality template replica.

Although PE films are not durable compared to Si, Ni, or even crosslinked polymer tools, they have been found useful as submaster (from which to form more durable tools) or short-run (limited lifetime) "tools" for forming accurate replicas in certain UV radiation cured materials, such as Dymax OP 4-20639 (Dymax Corporation, Torrington Conn.). For example, attempting to form UV tools or polymer masks directly from expensive templates (Si, crosslinked polymer, Ni, etc.), as described above, may frequently result in clogging or other damage to the template. A PE tool, on the other hand, can be formed as described above with very little chance of damage to the possibly very expensive template. Furthermore, this PE tool can be used multiple times to form a more durable tool (by Ni electroforming or UV crosslinking), or can itself be used multiple times for forming the in situ polymer mask described above. With even a short "lifespan" as a few dozen replications, such a tool costing pennies per copy, is much more cost effective than using a crosslinked polymer tool at ~$500/copy (6-in square, Holographix Corp, Hudson Mass.), or 6-in dia Si template (direct e-beam written at ~$7,000/each for a far IR FSS pattern), which may be rendered useless in as few as one or two replications.

Methods for Handling Thin PE Films

Ultra thin PE films (e.g., <15 microns in thickness) may be used as the substrate for the "dielectric molding" process, described above. However, it is well known that working with thin films, and PE in particular, can present a number of problems: simple handling is difficult due to the fragility of a film of that thickness, and they are very susceptible to mechanical distortion, as well as thermal distortion from even a modest heat source. For example, unsupported PE films (i.e., free standing, with no back support) are severely distorted during sputter coating, and attempting to thermally mold such films likewise is very difficult to accomplish.

One general approach to avoid problems with thin polymer films can be to bond the thin film to a thicker support film, which can be permanent if the application allows, or removable if not. This process requires the lamination bonding of the thin film to the thick film with some type of adhesive, which in itself can be difficult, since the handling and lamination process itself introduces the well-known "mottle" artifact to the bond, as well as requiring additional processing and costs. Furthermore, in the cases where the thin material must be removed, the two films must be delaminated, which is often problematic in that it is likely to introduce additional defects and/or artifacts due to the delamination process, in addition to representing additional cost and processing. In addition, any adhesive residue on the thin film may have to be removed.

Embodiments of the present disclosure provide technique/methods that are useful in working with thin PE films, ones which avoid many of the drawbacks of the prior art described above. In cases where the thin PE film is to be molded with a 3D pattern (such as described in detail in the co-pending U.S. Provisional Patent Application Ser. No. 60/987,630 filed on 13 Nov. 2007 and entitled "Antenna Devices Comprising Flexible Substrates, Related Structures, and Methods of Making and Using the Same"), the thin PE film may be thermally "adhered" to a polycarbonate (PC) film (any gauge from 1 to 5 mils or more is effective) by simply inserting the PC under the PE film during the thermal molding process.

High fidelity replication of nanoscale features in the PE film typically require temperatures less than 150 C for less than 120 sec. This results in a very uniform, adhesive-free removable bond between the PE and the PC films having extremely good optical qualities (essentially free of the mottle pattern exhibited by virtually all laminated adhesive systems), and further allowing the PE film to undergo vacuum deposition without distortion. The peel force required to separate the two films is medium to high and will not spontaneously separate, or do so under low separation forces. On the other hand, the require separation force is also low enough that the fragile PE film is not distorted during delamination from the PC. In addition, no residue is left on either surface and a secondary cleaning process is not required. Furthermore, the PC support film, being essentially unaffected by the process, can be reused, further minimizing process costs. For processes that do not also involve PE patterning, the PE film can be adhered to the PC film using a smooth heated surface (instead of a patterning template).

The bond formed by this process is likely a result of the high degree of stiction resulting from the smooth PC surface and the compliance of the PE above its Tg and chemical affinity between the PC and the PE. It should be noted that the same result is not obtained if PET or PEN or Kapton films are substituted for PC at reasonable temperatures for PE.

Removal of Side Wall Metal

Although line-of-sight deposition is more likely to preferentially deposit antenna or other pattern metal on the horizontal rather than vertical surfaces, the sputtering process tends to produce more conformal coatings, due to it close target to substrate distance and high gas pressure (shorter mean free path). In such instances, it is necessary to remove metal form the sidewalls in order to prevent shorting of the ground plane and the antenna plane.

It is a method of this disclosure that selective removal of excess antenna metal can be accomplished by one of several means described herein, which typically involves coating an extremely thin protective polymer over the conformally coated surface such that the polymer preferentially collects in the trenches of the molded dielectric, leaving a much thinner layer on the tops and side walls. This part of the polymer film can be removed by a very light plasma or chemical etch, followed by a metal etch, where the selectivity of the etch process only removes metal and not polymer, thereby leaving the antenna metal in the bottom of the trenches essentially untouched. The protective polymer can be the dielectric polymer (e.g., PE emulsion in the case of a far IF FSS), but in any event is so thin that it is unlikely to affect the optical properties if left in place. Various methods of selective removal of sidewall antenna metal are given in the figures that follow.

Large Scale Manufacturing

The concepts embodied in the current disclosure can be applied to fabrication of devices formed as individual discrete coupons or devices, but it is further a method of this disclosure to include the use of rotary patterning tools in a roll-to-roll ("R2R") process to create a structured polymeric layer for use as patterning masks as well as dielectric molded patterns, as described above. These embodiments further include R2R techniques for using said structured polymer layer to form a desired material pattern on a flexible substrate (such as by the addition or removal of material), and a R2R process for removal of any extraneous material after completion of the previous processes. These embodiments are previously disclosed by MicroContinuum in U.S. patent application Ser. No. 11/471,223 filed on Jun. 20, 2006, based on provisional patent application Ser. No. 60/692,078 filed Jun. 20, 2005 and the formation of pattern replicating tools as disclosed by MicroContinuum in U.S. patent application Ser. No. 11/711,928 filed on Feb. 27, 2007, based on provisional patent application Ser. Nos. 60/777,203 filed on Feb. 27, 2006 and 60/777,138 filed on Feb. 27, 2006; all of which applications are incorporated herein in their entireties by reference.

As described above, several different embodiments of the subject disclosure can be used to fabricate FSS and similar structures. FIGS. 1-21 illustrate the methods and apparatus used to achieve these results. For purposes of clarity, an arbitrary letter code is assigned to each process for ease of reference. Also, in cases where thin PE film is used, the polycarbonate film used to support it is not shown, and unless otherwise shown, line-of-sight vacuum deposition, where the perpendicular surfaces of the binary structure are predominately coated, is presumed. The patterned metal layer is referred to as the "antenna" layer as a convenience but can refer to any periodic (or non-periodic) patterned layer and should not be assumed to limit this layer to only features with antenna functionality. The polymer mask structures are formed by any of the methods described above (radiation cure, thermal or chemical molding of polymer layer, etc.). Most metal layers can be formed either by vacuum deposition, electroless or electroplating, chemical reduction, solution coating, etc, as described above.

FIG. 1. depicts a schematic view of a process 100 for creating the master template and multiple generations from the master template in accordance with embodiments of the present disclosure. As can be seen in the drawing, a master pattern can be created, e.g., at a semiconductor fabrication plant/process (1). Borrowing terminology from the optical disc molding industry, a parent (e.g., "father") polymer template can be formed from an etched (master) wafer by radiation curing of a polymer layer on a glass substrate (2). As shown as (3), a second generation template (e.g., Ni or polymer), referred to in the figure as the "mother" template, can be formed from the polymer template in (2). Finally, a 3rd generation tool or "stamper" made from a suitable material, e.g., Ni or polymer, can be formed at (4) for use in making multiple copies of the desired design (e.g., a positive or negative version of the one formed in the wafer in (1).

Figure 2:
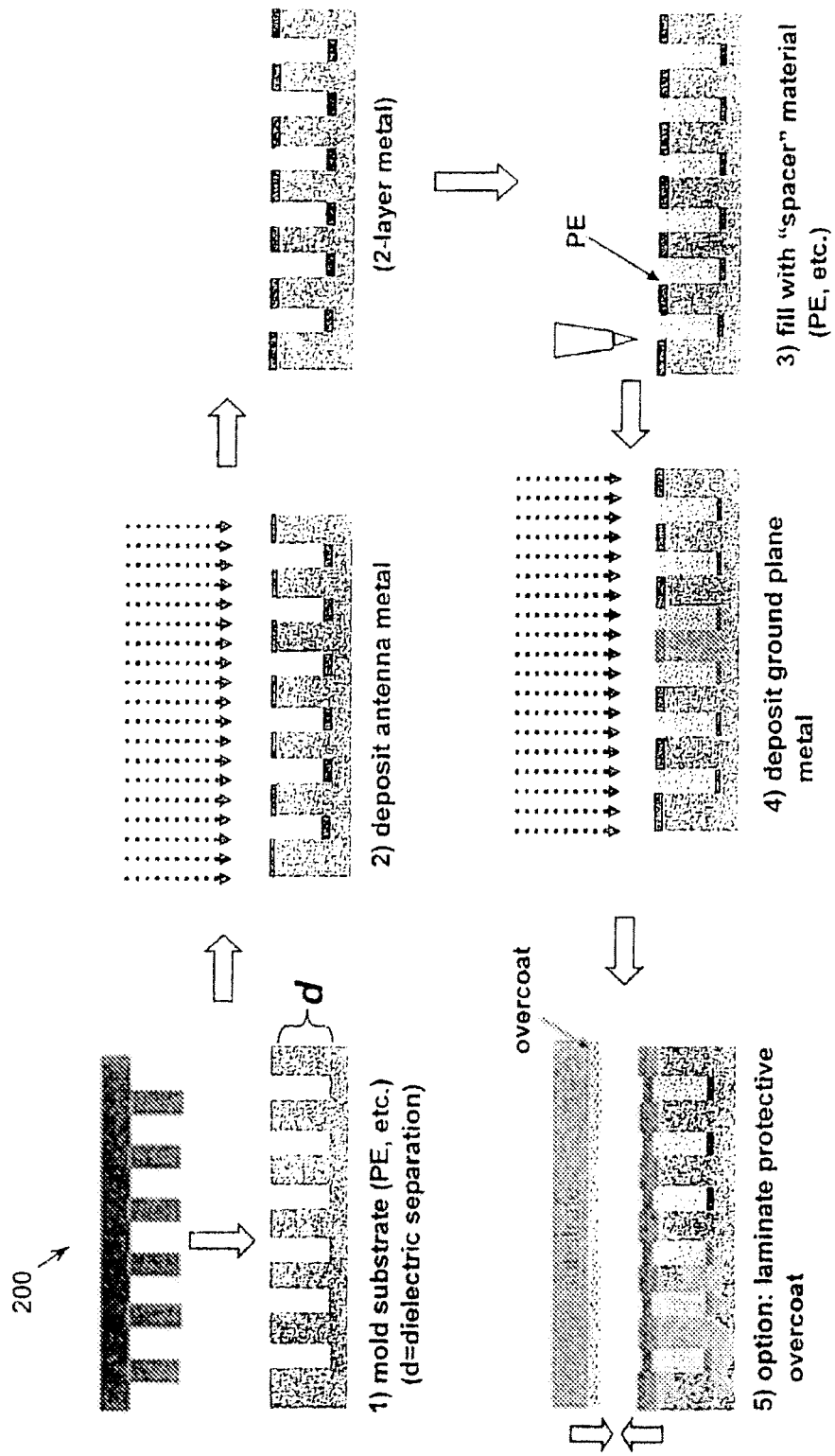
FIG. 2. depicts a schematic view of a process for forming a two level FSS structure, in accordance with embodiments of the present disclosure.

FIG. 2. depicts a schematic view of a process 200 for forming a two level FSS structure. The process 200 can include operation/steps of: molding a dielectric polymer layer (for example, thin polyethylene), depositing an antenna metal or conductive material, filling trenches with dielectric polymer (for example, a PE dispersion or dielectric nanoparticle material), depositing a ground plane, and laminate optional overcoat structure. The depth of the embossed pattern can be equal to the desired spacing between the patterned FSS (antenna) layer and ground plane. A ground plane can be deposited over the excess antenna metal on upper surface.

Figure 3:
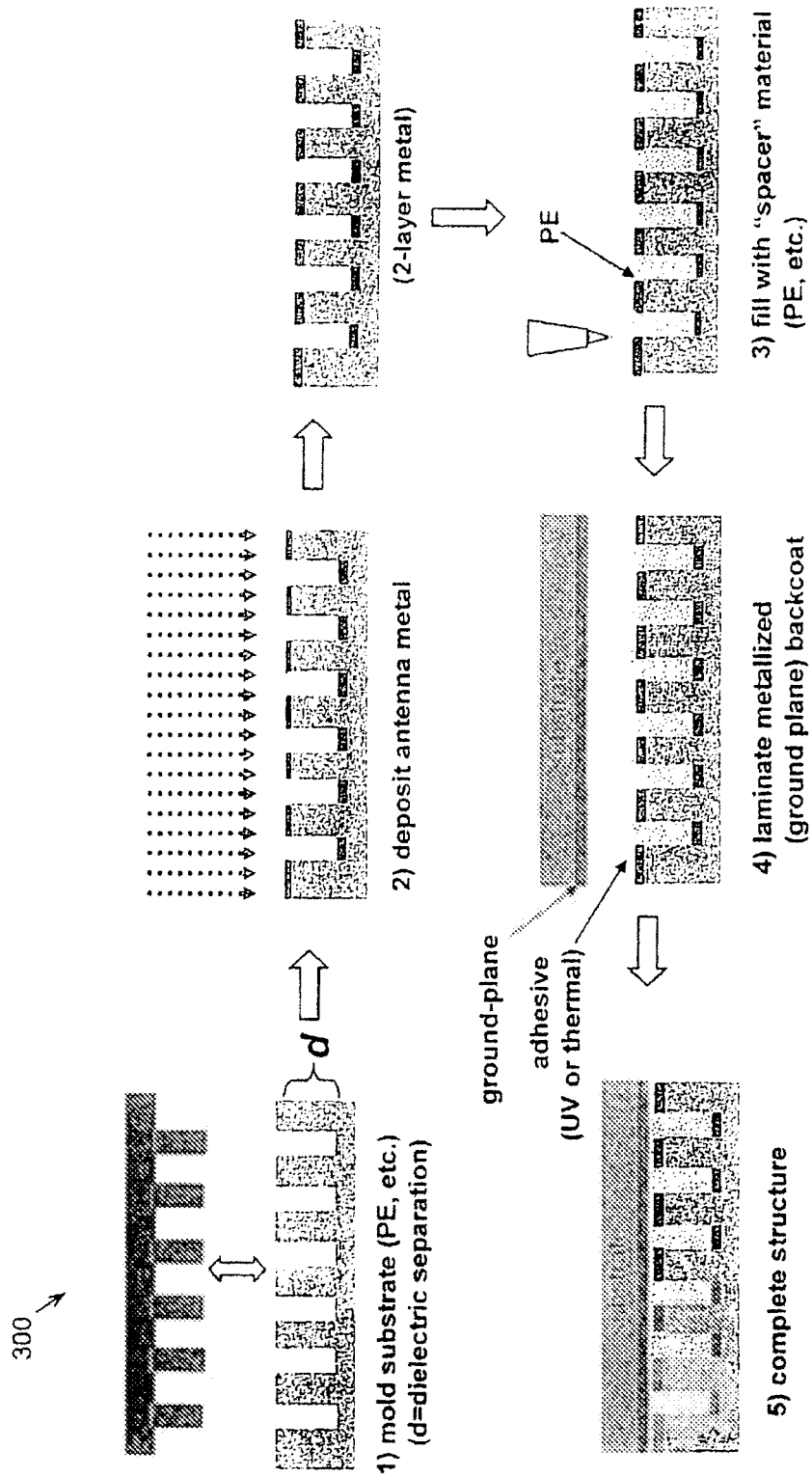
FIG. 3. depicts a schematic view of a process for forming a two level FSS structure, in accordance with further embodiments of the present disclosure.

FIG. 3. depicts a schematic view of a process 300 for forming a two level FSS structure similar to process 200, but ground plane is pre-deposited on a separate film which is laminated to dielectric filled FSS trench structure.

Figure 4:
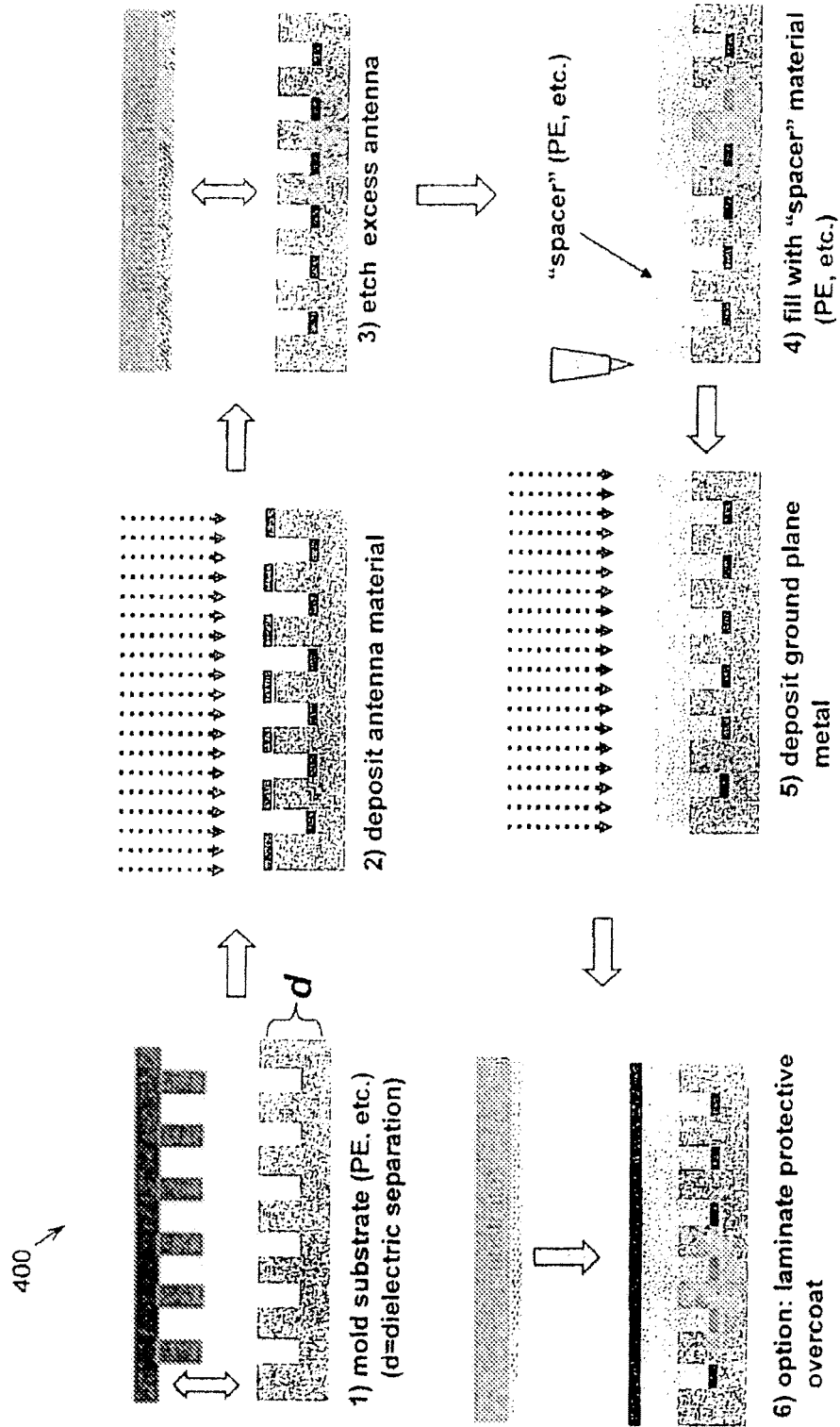
FIG. 4. depicts a schematic view of a process for forming two level FSS structure, in accordance with a further embodiment of the present disclosure.

FIG. 4. depicts a schematic view of a process 400 for forming a two level FSS structure: molding a dielectric layer, depositing antenna metal, selectively etching excess antenna metal (from top and side walls) using thin layer absorbant pad containing etchant, coating a dielectric (e.g., nanoparticulate or PE emulsion) to spacer depth, depositing ground plane, and (optionally) laminate protective overcoat.

Figure 5:
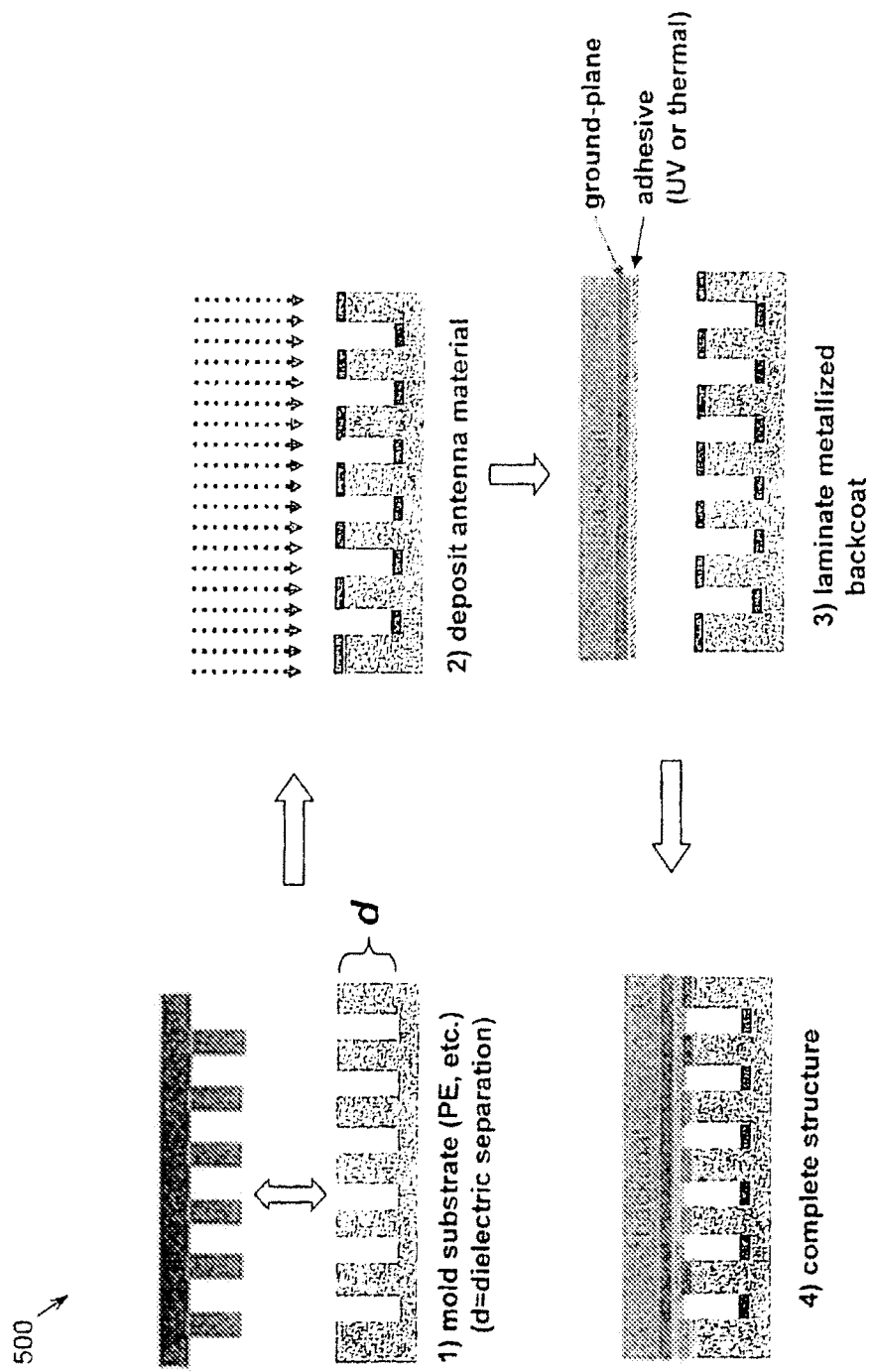
FIG. 5 depicts a schematic view of a process that is similar to the process of FIG. 3, but that utilizes an air gap.

FIG. 5 depicts a schematic view of a process 500 that is similar to process 300 if FIG. 3, but utilizes no trench fill ("air gap").

Figure 6B:
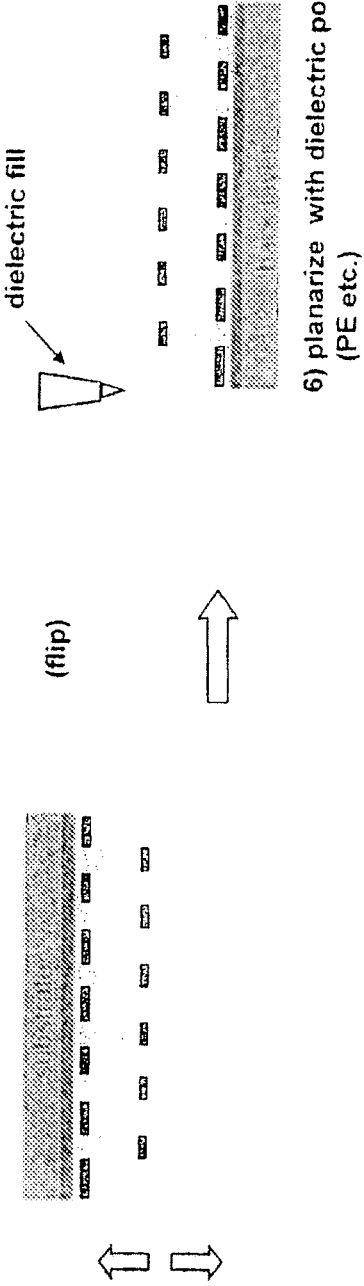
FIG. 6 includes FIGS. 6A-6B, which depict a schematic view of a process that forms a temporary mold in a material that is not required to be the dielectric material, in accordance with exemplary embodiments of the present disclosure.

FIG. 6 depicts a schematic view of a process 600 that utilizes a temporary mold in a material that is not required to be a dielectric material, antenna layer deposit, dielectric trench fill, laminate ground plane, then separate the "dielectric replica" along with adherent metal, then fill remaining structure with dielectric (e.g., PE emulsion or dielectric nanoparticlates). The fill layer can slightly overfill the pattern depth for additional protection of structure. The use of a temporary mold allows a wider selection of the mold's material properties, thereby allowing for potentially improved release properties, for example, since the mold is not incorporated into the final structure.

FIG. 7 depicts a schematic view of a process 700 that is similar to process 600, except temporary mold is made from soluble material that can de removed by appropriate solvent to separate from "dielectric replica", followed by dielectric fill.

Figure 8B:
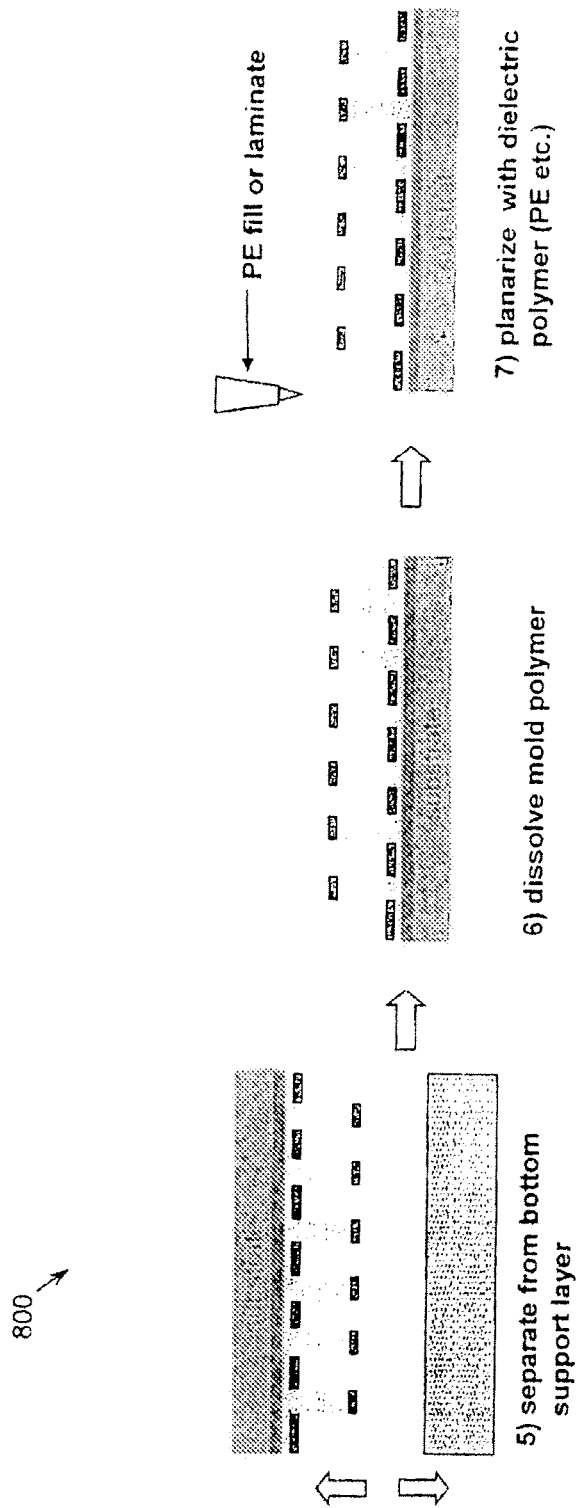
FIG. 8 includes FIGS. 8A-8B, which depict a schematic view of a process in which a temporary mold comprises a thin embossable film on inert support film, in accordance with a further embodiment of the present disclosure.

FIG. 8 depicts a schematic view of a process 800, that is similar to process 700, except temporary mold comprises thin embossable material that is released from a support film, requiring dissolution of less material relative to process 700.

Figure 9A:
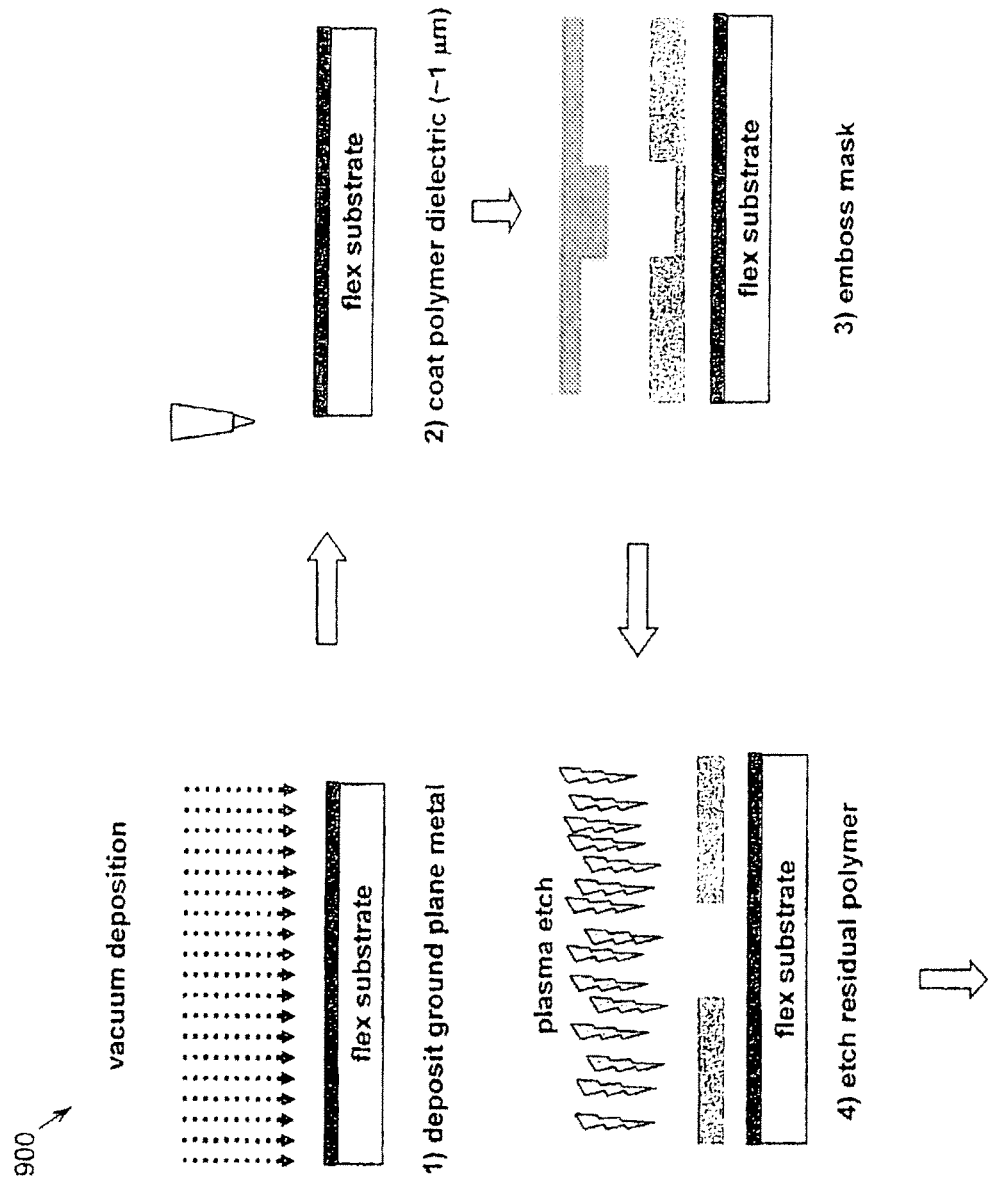
FIG. 9 includes FIGS. 9A-9B, which depict a schematic view of a method utilizing in situ temporary polymer mask process for fabricating multilayer FSS-like structure, in accordance with a further embodiment of the present disclosure.
Figure 9B:
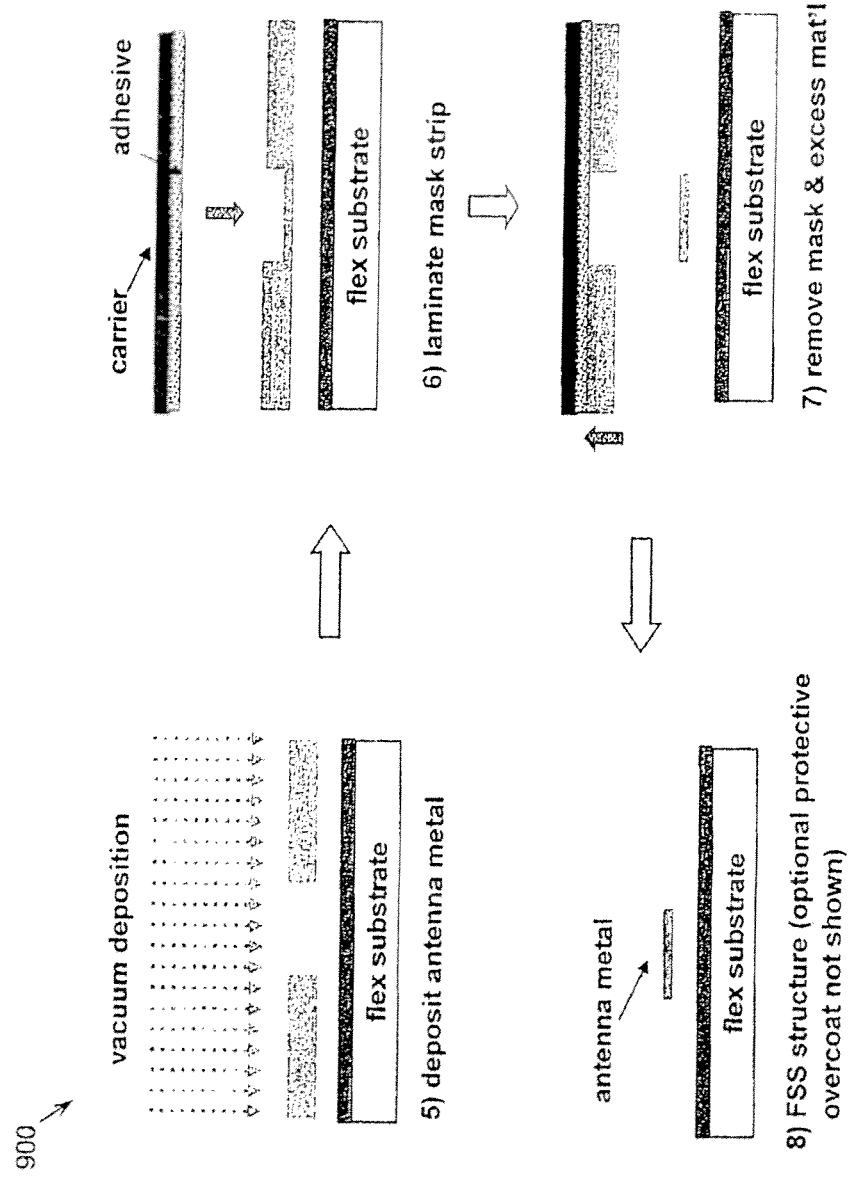

FIG. 9 depicts a schematic view of a process 900 that illustrates an in situ temporary polymer mask process for fabricating multilayer FSS-like structure beginning from ground plane, which is deposited on a carrier/support film, followed by correct thickness of dielectric spacer material, followed by molding of additive mask relief pattern. Polymer mask is etched to remove residual (scum) polymer from the bottom of the relief pattern (etch stop is optional, as over-etching will have minimal deleterious effect), followed by deposition of antenna metal. Excess mask and overcoated antenna metal is stripped by mechanical means (e.g., adhesive, as shown) or chemical means. Protective overcoat (not shown) is optional, but must be sufficiently transmissive in front of the FSS layer so as not to interfere with performance of device.

Figure 10A:
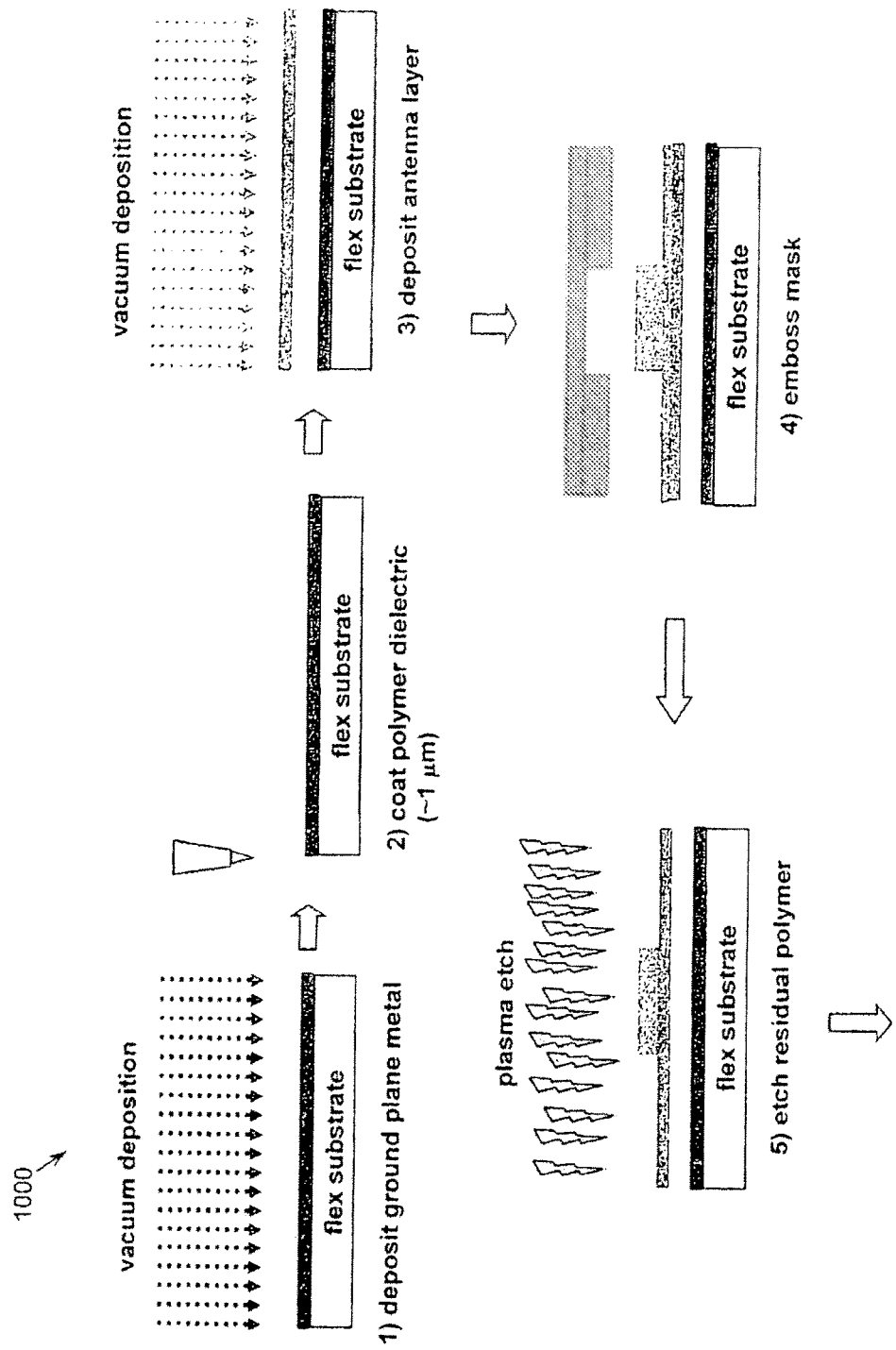
FIG. 10 includes FIGS. 10A-10B, which depict a schematic view of a process implementing a subtractive version of the method of FIG. 9.

FIG. 10 depicts a schematic view of a process 1000 that illustrates the subtractive version of the method/process of FIG. 9. For process 1000 the ground plane and dielectric spacer layer are deposited, followed by the deposition of a continuous antenna layer. A subtractive mask (the inverse of the additive mask in 900) is formed and the residue etched, followed by etch of the antenna metal (plasma or chemical), after which the mask is removed (by mechanical or chemical means). Additional stop layers may be included as needed, such as between the antenna layer and the dielectric layer, although in this case it is not necessary, because the polymer layer itself is not attacked by the plasma etch process, thus no stop is needed. The subtractive mask polymer layer covering the antenna metal structure may be left in place if it does not significantly affect the device performance, thus a step may be saved by eliminating this step (and may also provide additional protection for the pattern layer). Additional (optional) protective overcoat not shown.

Figure 11A:
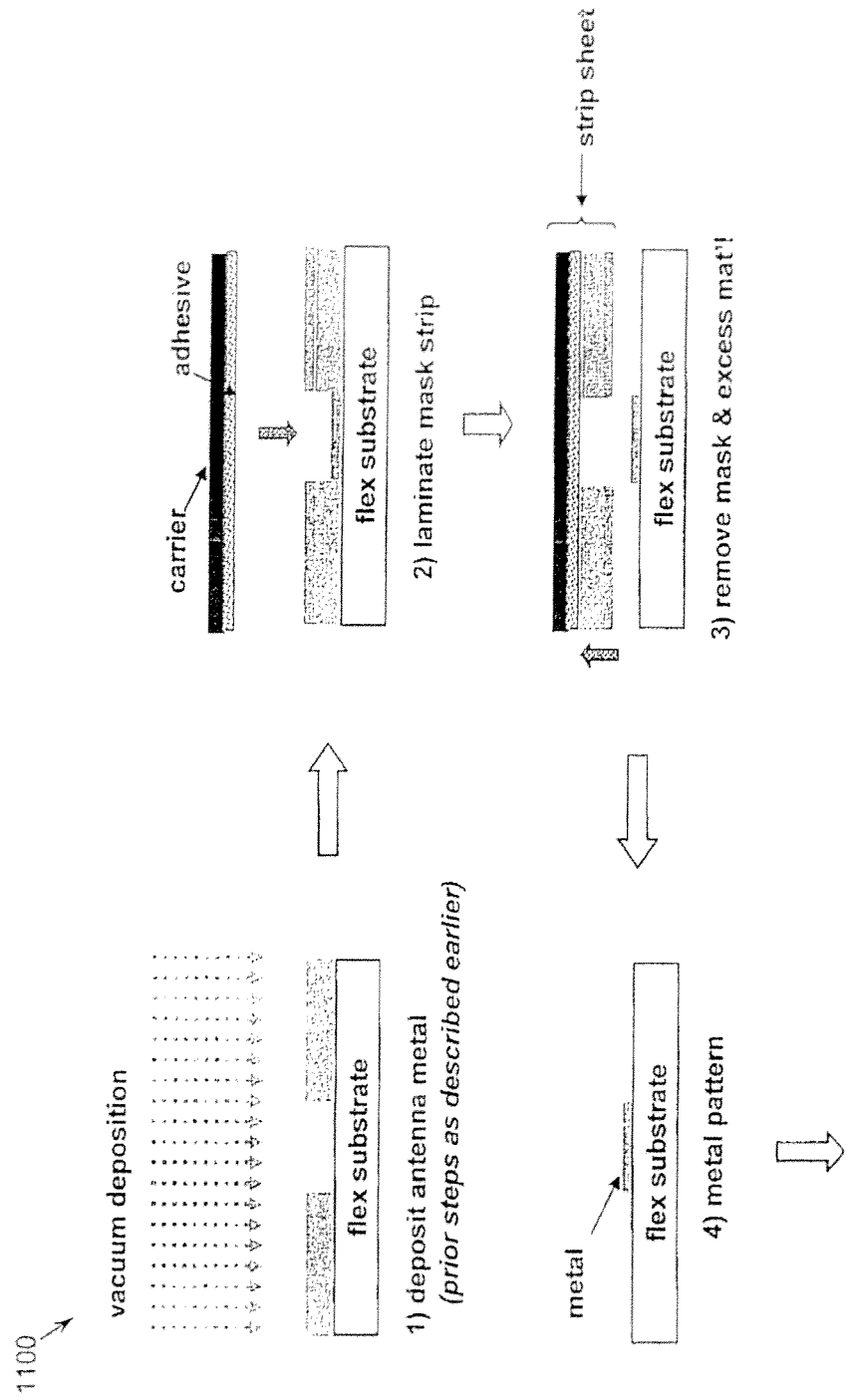
FIG. 11 includes FIGS. 11A-11B, which depict a schematic view of a method that is a top down additive process in which the FSS structure is formed from the first (top) layer down to the last (antenna) layer, in accordance with a further embodiment of the present disclosure.

FIG. 11 depicts a schematic view of a process 1100 that is a top down additive process in which the FSS structure is formed from the first (top) layer down to the last (antenna) layer. The antenna layer is added (deposited) over the molded and de-scummed polymer layer, followed by the removal of the excess polymer and antenna material. The dielectric spacer layer is then coated to the correct thickness and the ground plane layer is subsequently deposited. An optional (not shown) support layer can be laminated over the ground plane for added protection. It should be noted that the flexible substrate upon which this process is built must be thin enough so as not to interfere with the radiation wavelength of interest. For the far IR, this requires approx 10 microns max of PE film thickness, thus such structures require the addition of a temporary support film, such as polycarbonate, as described above.

Figure 12A:
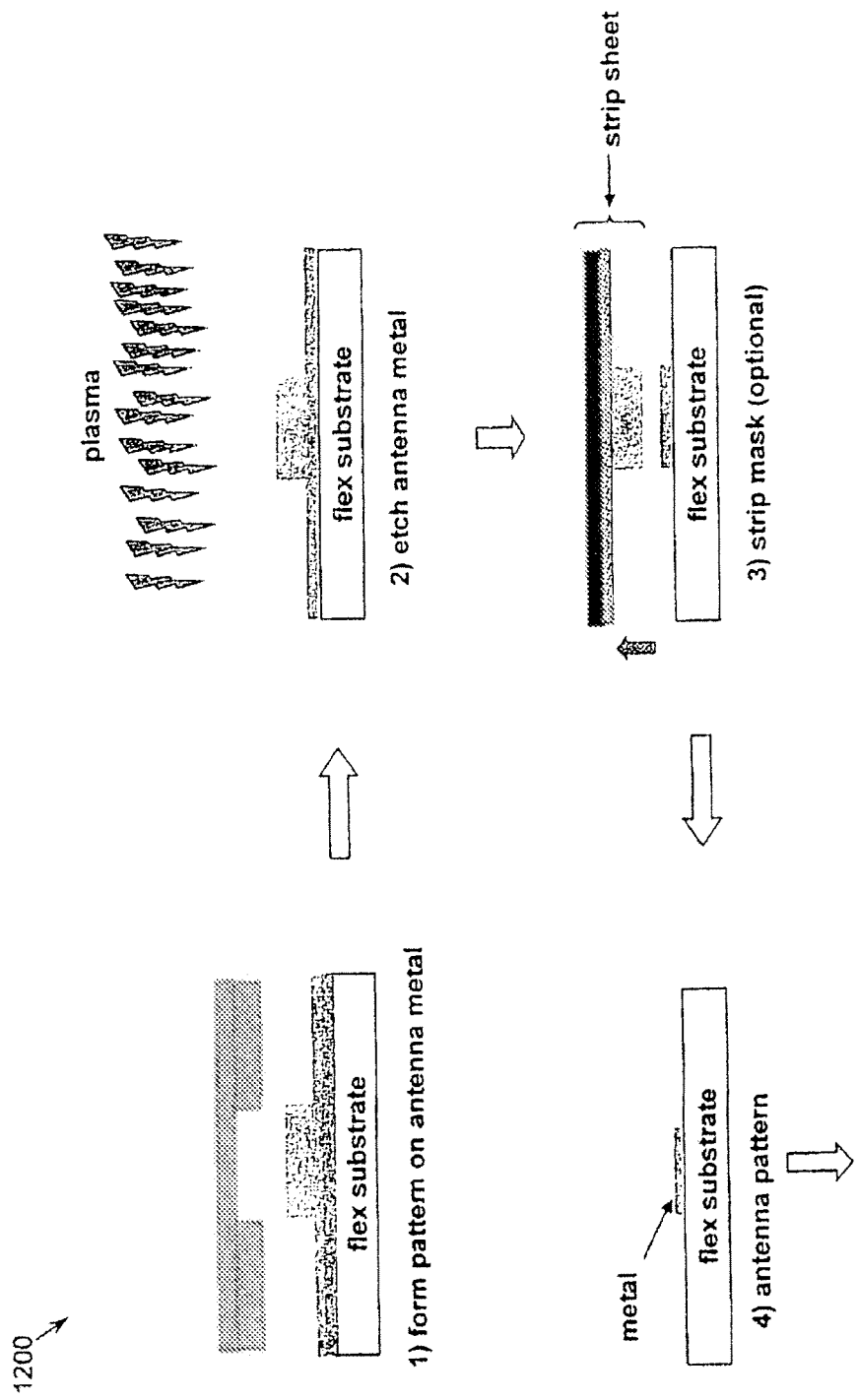
FIG. 12 includes FIGS. 12A-12B, which depict a schematic view of a method that is a top down subtractive analog of the method of FIG. 11.

FIG. 12 depicts a schematic view of a process 1200 that is the top down subtractive analog of process 1100 of FIG. 11. Starting with the antenna-metal coated support film, the subtractive mask pattern is molded and the residue polymer removed. The spent mask is then (optionally) removed and the dielectric layer coated to the correct spacer thickness. The ground plane is next deposited, followed by the (optional) protective overcoat. Again, if the film onto which the antenna metal is deposited must be very thin, then a temporary bonded support film (not shown) is required.

Figure 13:
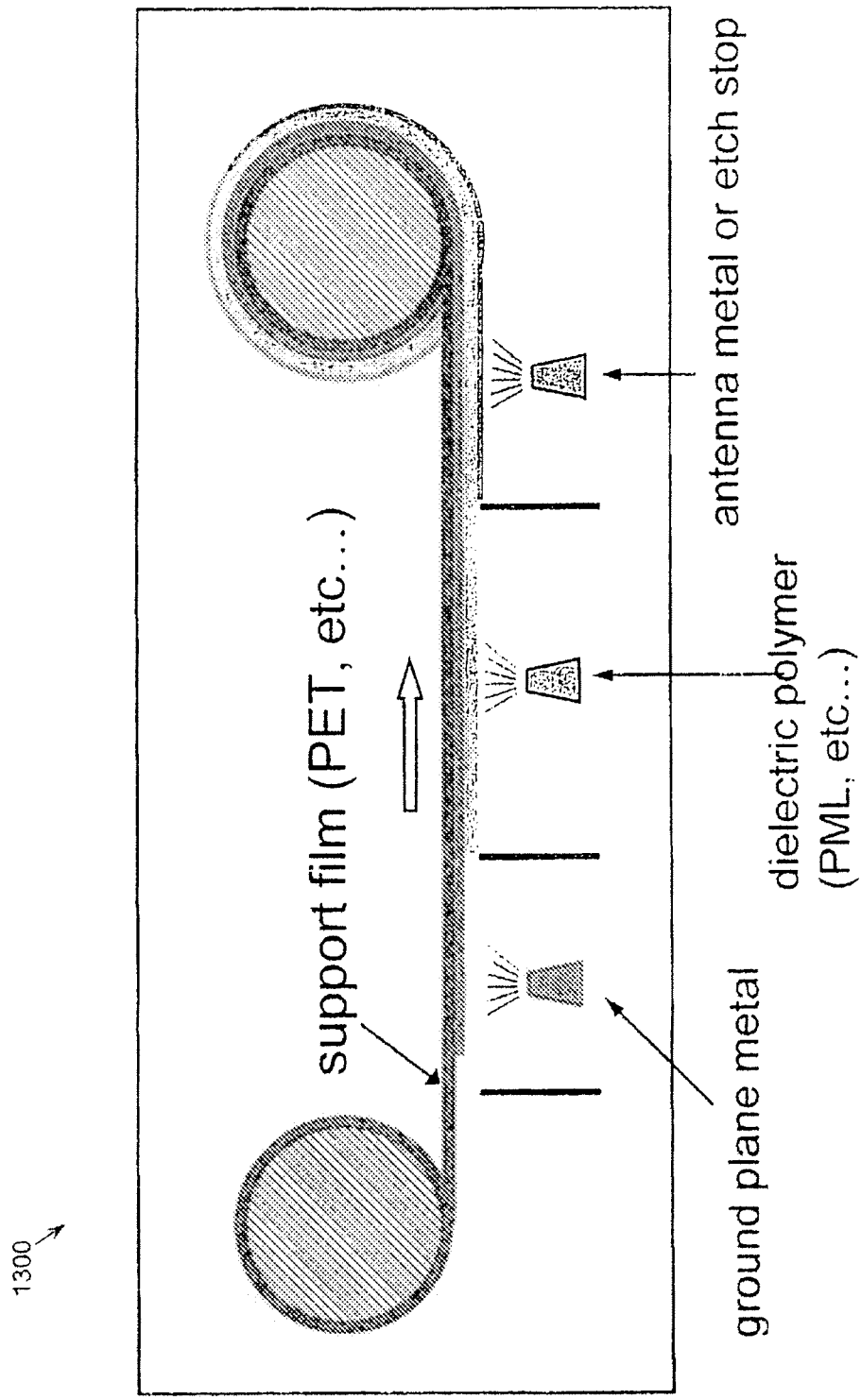
FIG. 13 depicts a schematic view of a continuous roll-to-roll process in accordance with a further embodiment of the present disclosure.

FIG. 13 depicts a schematic view of a process 1300 in accordance with a further embodiment of the present disclosure. This figure illustrates the continuous R2R formation of the base film ("feedstock") for the bottom up subtractive process. Similar scenarios can be used for some of the other methods in order to optimize processing efficiency (and minimize cost). The dielectric spacer layer may also be a polymer deposited by the "PML" vacuum polymer deposition process, a high deposition rate process that is capable of very uniform thickness deposition.

Figure 14:
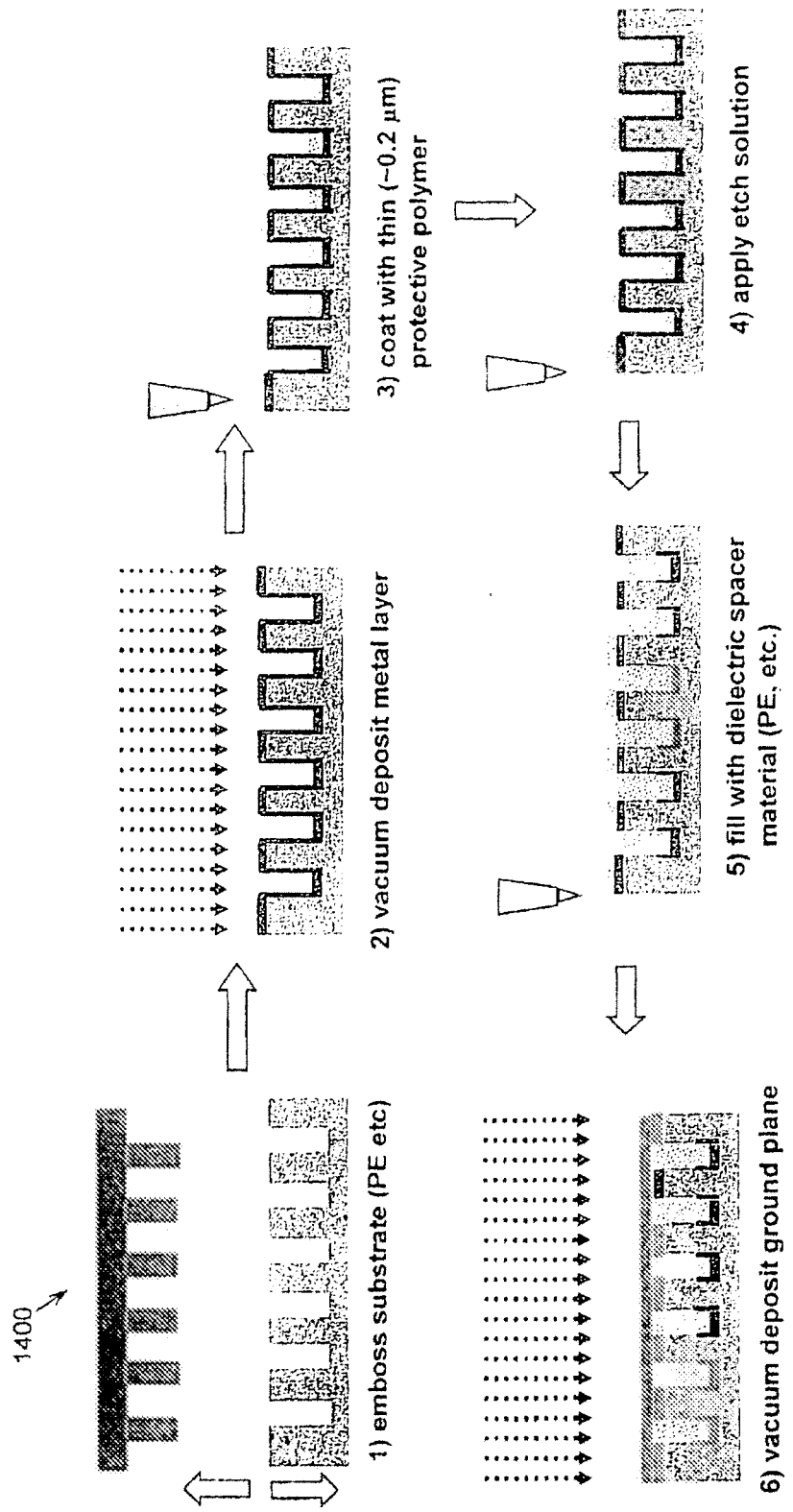
FIG. 14 depicts a schematic illustration of a method for removing extraneous side-wall deposited metal in the case of unwanted conformal (or semi-conformal) deposition of metal on a molded dielectric pattern, in accordance with embodiments of the present disclosure.

FIG. 14 depicts a schematic illustration of a method 1400 that may be used to remove extraneous sidewall deposit of antenna metal in the case of unwanted conformal (or semi-conformal) deposition of antenna metal on the molded dielectric pattern. In this case, for example, an extremely dilute PE emulsion (<1%) or other thin polymeric coating is applied to the antennal metal-coated surface of the molded dielectric material. Chemical etching is used to remove the weakly protected (virtually exposed) metal on the top and sidewalls of the structure. Alternatively, a quick exposure to an oxygen plasma will remove the thinnest parts of the polymer overcoat, allowing the metal to be thereby etched by a plasma or chemical etch process, where the metal in the bottom of the trenches, having a thicker protective polymer, will 11 not be readily removed by the etch process.

Figure 15:
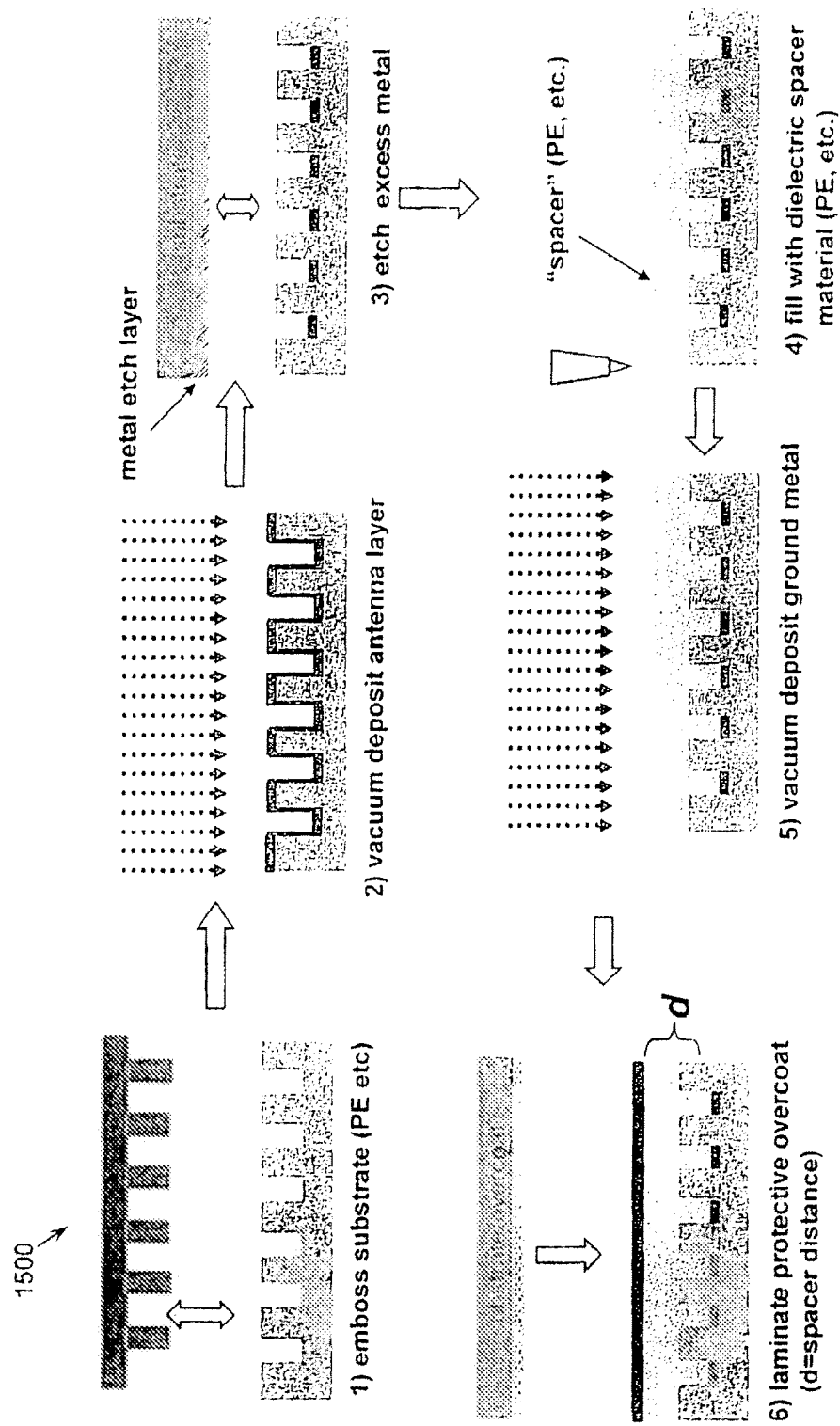
FIG. 15 depicts a schematic illustration of another method for removing extraneous side-wall deposited metal in the case of unwanted conformal (or semi-conformal) deposition of metal on a molded dielectric pattern, in accordance with embodiments of the present disclosure, in accordance with further embodiments of the present disclosure.

FIG. 15 depicts a schematic illustration of a method 1500 in accordance with further embodiments of the present disclosure. In method 1500, a "sponge"-like layer of polymeric material is imbibed with antenna metal etchant, which is then brought into contact with the top surface of the conformally-coated structure. Pressure and/or a small amount of aqueous solution will cause the etchant to contact and remove the upper metal layer, leaving the material at the very bottom of the trenches intact.

Figure 16:
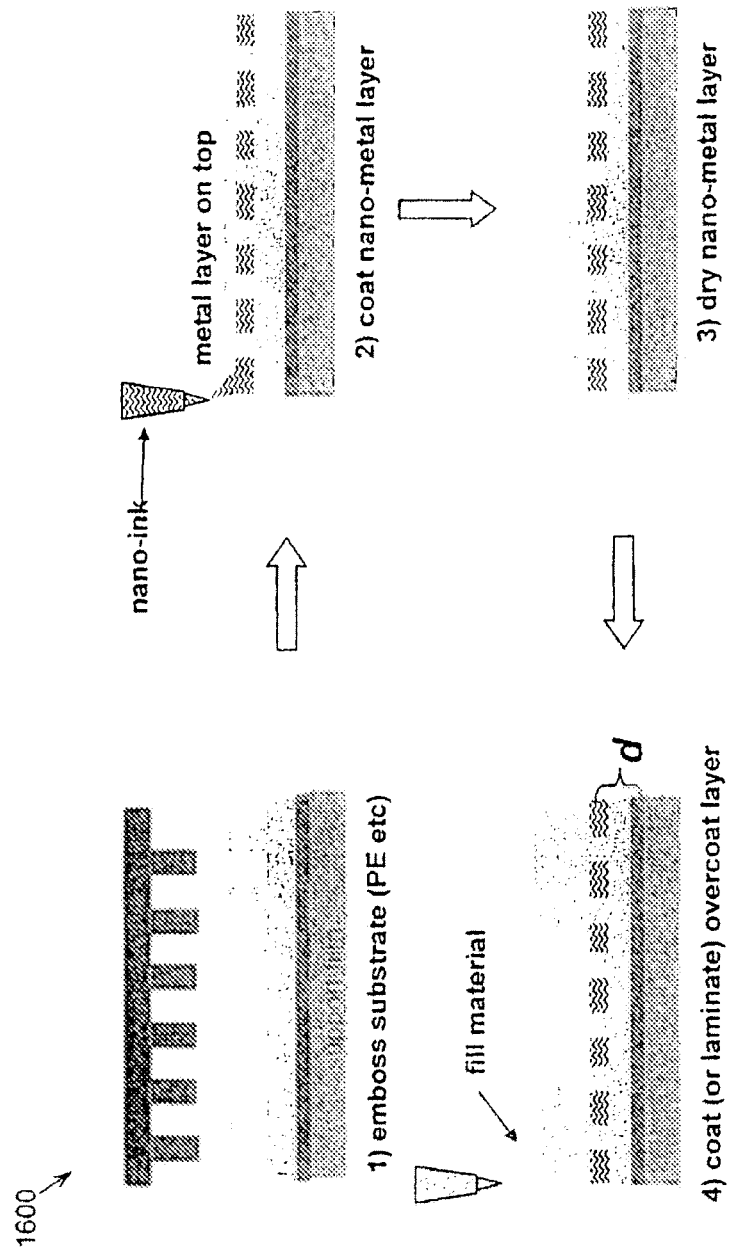
FIG. 16 depicts a schematic illustration of a method for forming a metal pattern layer using an "ink" including metal nanoparticles, in accordance with a further embodiment of the present disclosure.

FIG. 16 depicts a schematic illustration of a method 1600. FIG. 16 illustrates an alternative form of selective antenna metal deposition utilizes a nano ink comprising nanoparticles of the antenna metal (e.g., gold) that is coated over the molded dielectric structure. The bulk of the metal will collect in the trenches, particularly if the structure is designed such that the tops of the upper layer ("plateaus") are slightly convex. It is, of course, important to consider the effect of surface tension is such small structures, but the use of surfactants and surface activating treatments (corona, etc.) can be used to modify the wetting properties of the solution-dielectric interface.

Figure 17:
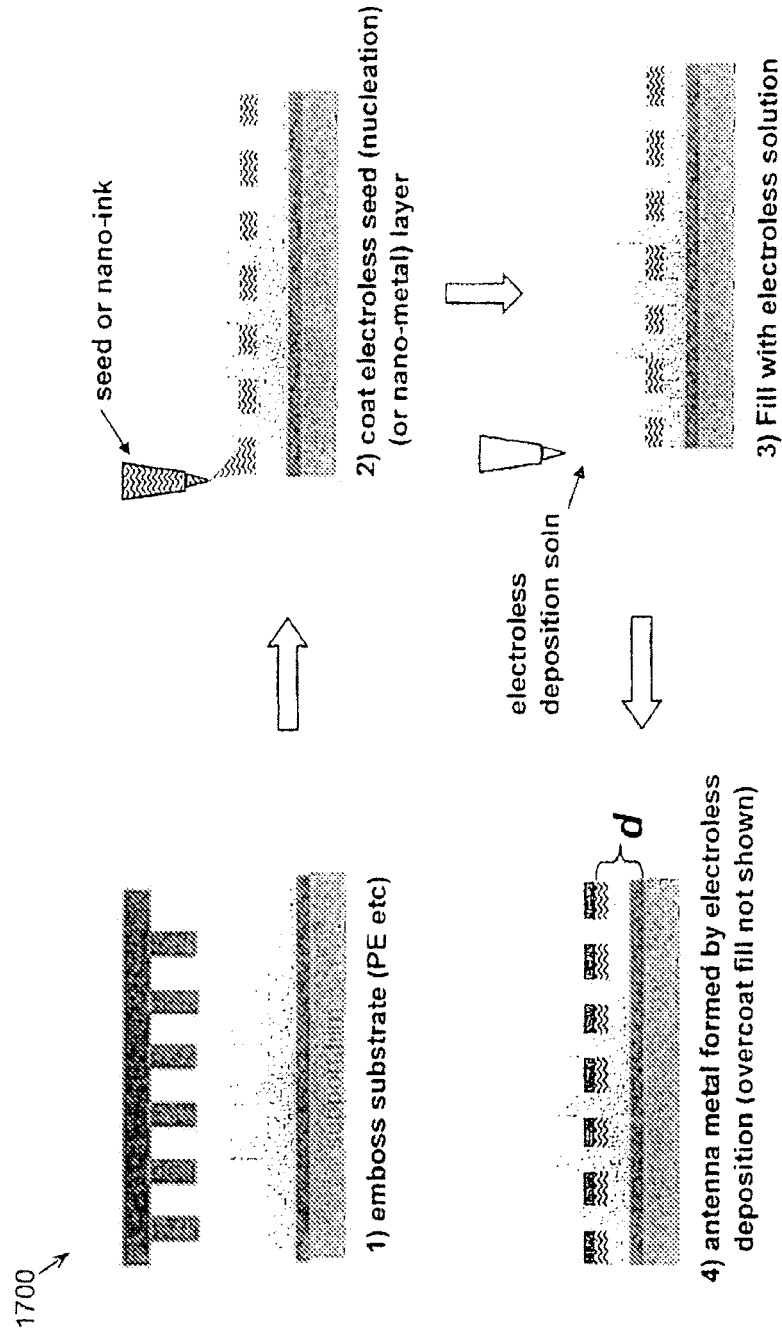
FIG. 17 depicts a schematic illustration of a method similar to that of FIG. 16, except the nano ink solution is acting as a "seed" layer to nucleate the deposition of metal from an electroless metal solution, in accordance with a further embodiment of the present disclosure.

FIG. 17 depicts a schematic illustration of a method 1700 shown here is similar to Process 1600 of FIG. 16, except in this case the nano ink solution is replaced by a dilute "seed" layer to nucleate the deposition of metal from an electroless metal solution, thus the small amount of seed nuclei is "amplified" by the deposition of a thicker electroless deposit.

Figure 18A:
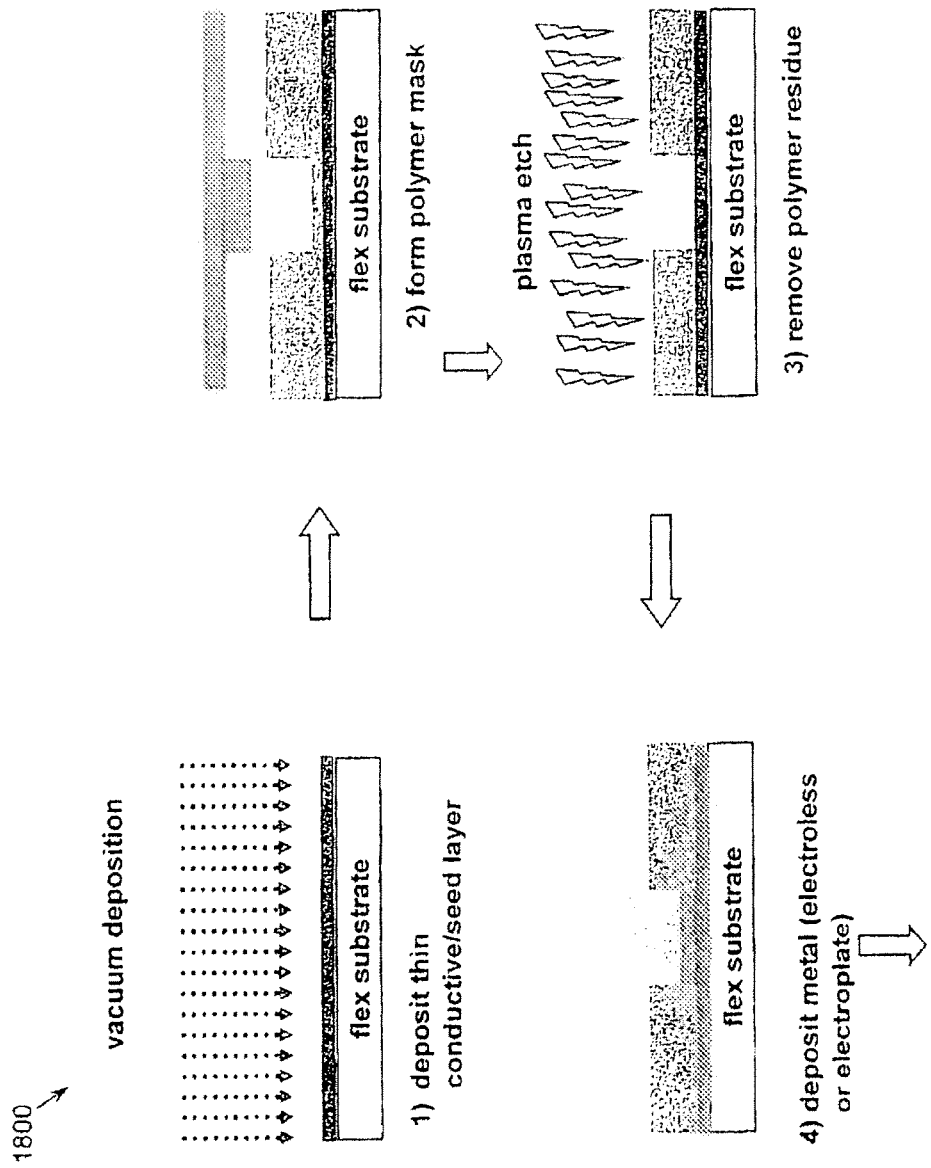
FIG. 18 includes FIGS. 18A-18B, which depict a schematic illustration of a method that illustrates yet another embodiment of the process for forming the patterned metal layer which includes the use of a conductive or "seed" layer for the subsequent selective electro- or electroless deposition of a metal layer, followed by the formation of spacer and other plain or patterned layers.
Figure 18B:
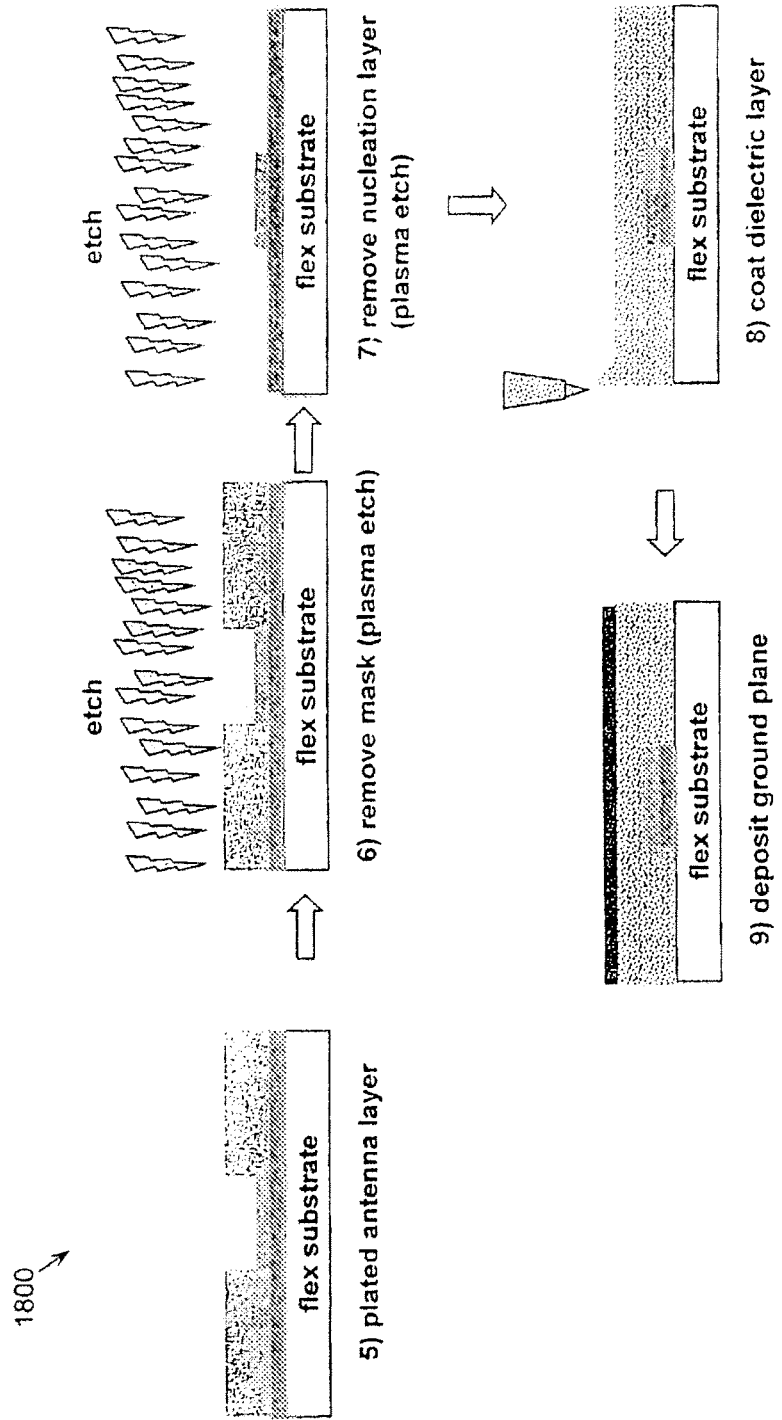

FIG. 18 depicts a schematic illustration of a method 1800 that illustrates yet another embodiment of the process for forming the patterned antenna metal layer. In this top down additive process, a thin conductive or seed layer is deposited (by vacuum or solution coating) continuously over the substrate surface. An additive polymer mask is formed over this layer, etched to remove the residual polymer layer, and immersed in an electroplating (or electroless) bath in order to deposit (build up) the requisite thickness of antenna metal. The spent polymer mask is then removed (by etch or lift-off), followed by etching of the thin conductive/seed layer to prevent shorting of the individual antenna elements. Finally, the dielectric spacer layer and the ground plane metal are deposited.

Figure 19A:
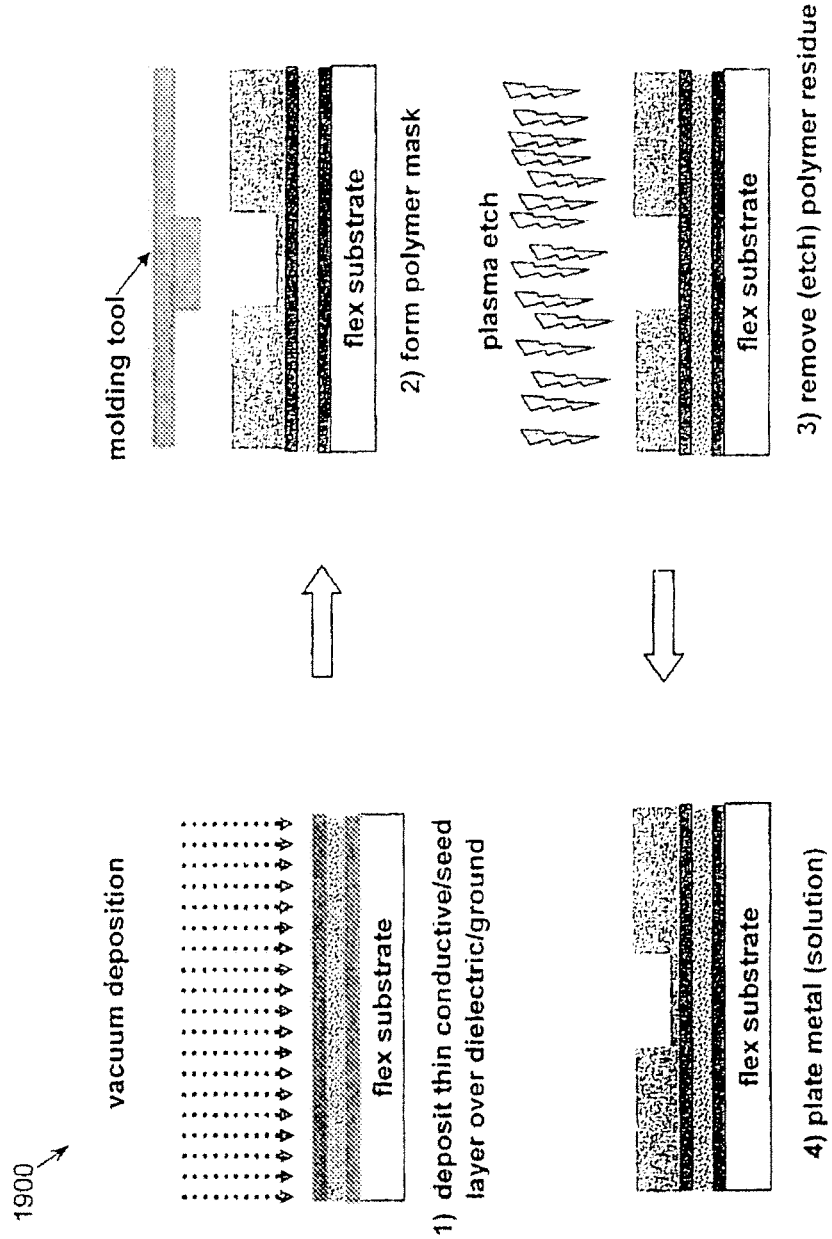
FIG. 19 includes FIGS. 19A-19B, which depict a schematic illustration of a method that is the bottom up (additive) version of the top down process of FIG. 18.
Figure 19B:
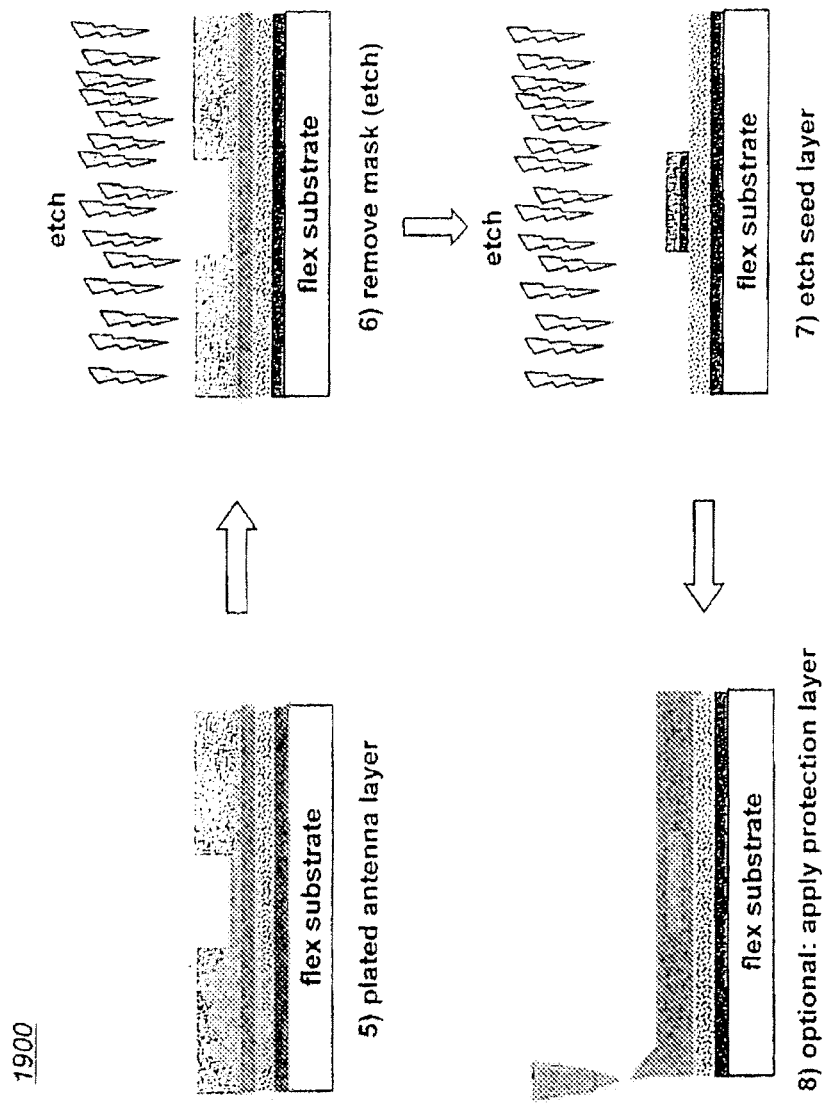

FIG. 19 depicts a schematic illustration of a method 1900 that is the bottom up (additive) version of the top down process of method 1800. The processes are very similar, except that the ground plane and dielectric spacer layers are coated prior to the conductive/seed layer. After plating the antenna metal, the mask and conductive/seed layer are removed. It may also be seen that subtractive versions of Process 1800 and 1900 (not shown) can be realized by deposition of a continuous antenna layer, followed by formation (and de-scumming) of the subtractive polymer mask pattern. This time reverse electroplating ("electropolishing") is used to remove exposed conductive material.

Figure 20:
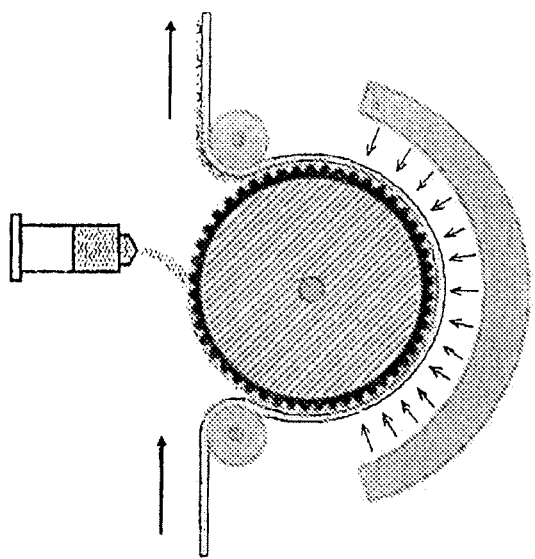
FIG. 20 depicts a schematic illustration of a method and system/apparatus for continuous formation of a mask layer using an externally irradiated patterning drum in forming the desired pattern layer, in accordance with exemplary embodiments of the present disclosure.

FIG. 20 depicts a schematic illustration of a method 2000 and apparatus in accordance with exemplary embodiments of the present disclosure. Method 2000 shows the key step in the continuous R2R version of the polymer mask formation process (additive or subtractive), whereby the polymer ask is formed on the substrate by radiation cure to harden the mask (see, e.g., previously disclosed by MicroContinuum in U.S. patent application Ser. No. 11/471,223 filed on 20 Jun. 2006, claiming priority to U.S. Provisional Patent Application Ser. No. 60/692,078 filed 20 Jun. 2005 and the formation of pattern replicating tools as disclosed by MicroContinuum in U.S. patent application Ser. No. 11/711,928 filed on 27 Feb. 2007, claiming priority to U.S. Provisional Patent Application Ser. No. 60/777,203 filed on 27 Feb. 2006 and U.S. Provisional Patent Application Ser. No. 60/777,138 filed on 27 Feb. 2006; all of which application are incorporated herein by reference in their entireties.)

Figure 21:
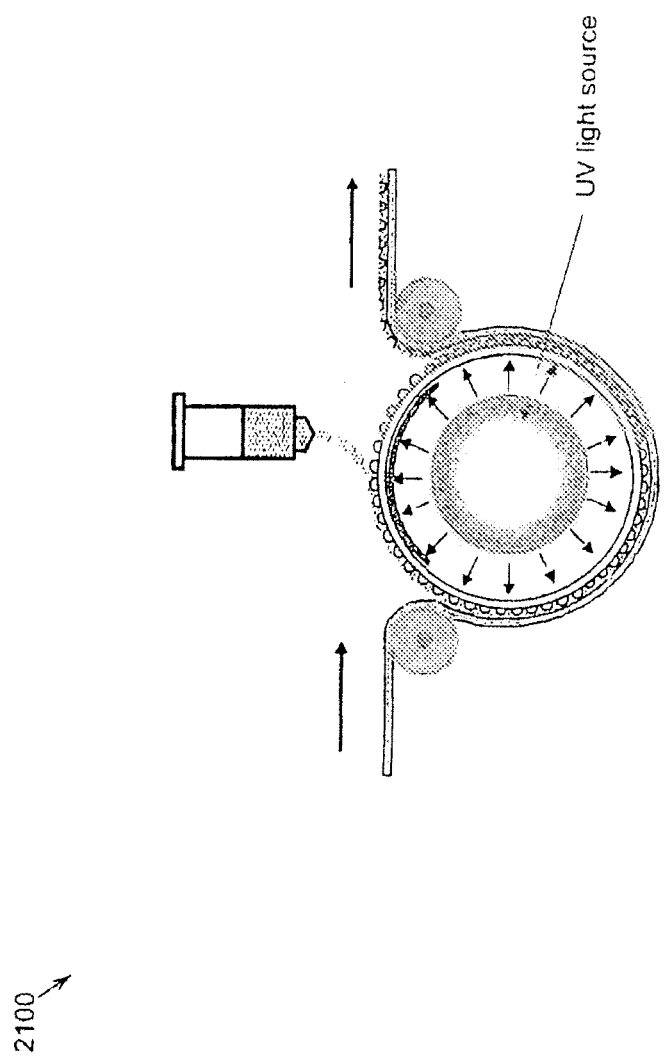
FIG. 21 depicts a continuous R2R process and system/apparatus similar to those shown in FIG. 20 for continuous formation of a mask layer using an internally irradiated patterning drum in forming the desired pattern layer, in accordance with exemplary embodiments of the present disclosure.

FIG. 21 depicts a continuous R2R process 2100 and apparatus that are similar to those shown in FIG. 20 and as described in Applicant's co-pending U.S. patent application Ser. No. 11/711,928. Process 2100 may be similar to process 2000, except where pre-coated opaque layers are required which block the wavelength of the crosslinking radiation, the polymer mask must be cured from the inside of a (transparent) patterning drum.

Figure 22:
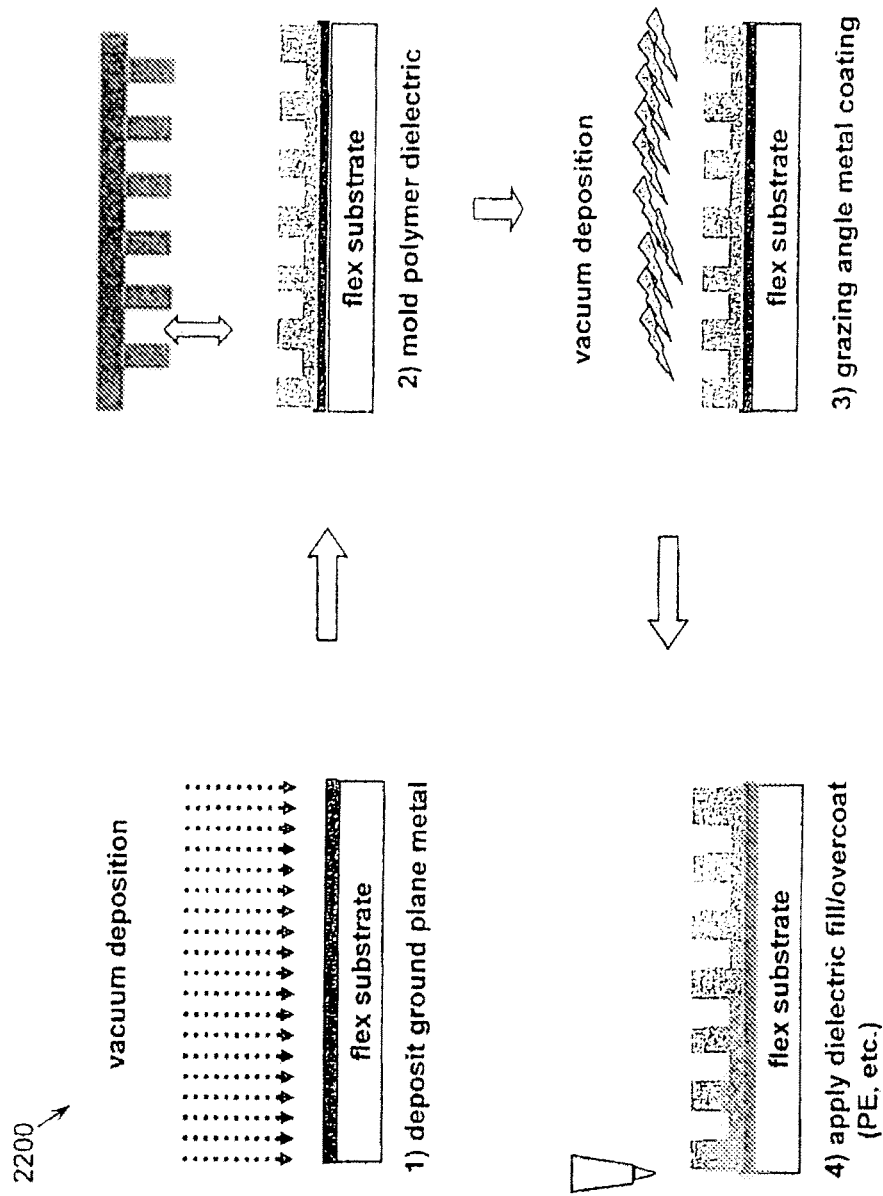
FIG. 22 depicts a schematic view of a process in which a dielectric polymer layer is molded onto the surface of a substrate comprising a carrier and pre-coated ground plane layer, in accordance with further embodiments of the present disclosure.

FIG. 22 depicts a schematic view of a process 2200 in which a dielectric polymer layer is molded onto the surface of a substrate comprising a carrier and pre-coated ground plane layer, in accordance with exemplary embodiments of the present disclosure. After molding the desired pattern and with the desired depth, a metal conductive layer is deposited by vacuum means at a very low angle with respect to the plane of the substrate, thereby only coating the top areas of the molded pattern. The pattern depth plus the residual polymer distance to the ground plane can be designed to represent a specific spacing. The coated multilevel structure can also be filled and/or overcoated with a dielectric polymer solution to protect the structure.

Thus, aspects and embodiments of the present disclosure can provide various advantages compared to prior art techniques. For example, embodiments can provide for the construction of FSS structures, antenna arrays for solar rectennas, etc. on flexible substrates. Additionally, exemplary embodiments can provide improved methods for forming copies of master templates with high aspect ratios and/or high surface areas that may be otherwise difficult to replicate. Such methods may be applicable to the fabrication of tools used for large-scale production of FSS and other structures utilizing 3D patterns that are difficult to replicate.

While certain embodiments have been described herein, it will be understood by one skilled in the art that the methods, systems, and apparatus of the present disclosure may be embodied in other specific forms without departing from the spirit thereof.

Accordingly, the embodiments/aspects described herein, and as claimed in the attached claims, are to be considered in all respects as illustrative of the present disclosure and not restrictive.

What is claimed is:

1. A method of construction of a frequency selective surface (FSS) on a flexible substrate, the method comprising:
   forming at least one set of alternating material layers on a flexible support layer, the at least one set of alternating material layers comprising a first electrically conductive material and a second electrically insulating material;
   using nanoimprint lithography to form a polymeric relief mask layer on an uppermost layer of the at least one set of alternating material layers;
   using the polymeric relief mask layer to form a periodic patterned material layer with a desired pattern on the uppermost layer; and
   lifting the polymeric relief mask layer from the underlying at least one set of alternating material layers, thereby forming a FSS structure on a flexible substrate.

2. The method of claim 1, wherein the periodic patterned material layer comprises the first electrically conductive material.

3. The method of claim 1, wherein the periodic patterned material layer is a conductive ground plane.

4. The method of claim 1, wherein forming the at least one set of alternating material layers includes using a rotary pattern tool in a roll-to-roll process.

5. The method of claim 2, wherein the first electrically conductive material comprises a conductive polymer or conductive particles in a polymer binder.

6. The method of claim 1, wherein forming the patterned material layer includes forming one or more multi-layer coatings.

7. The method of claim 4, wherein using the roll-to-roll process includes using a rotary drum tool.

8. The method of claim 7, wherein using the rotary drum tool includes using a rotary drum tool having a master pattern formed on the outside of the rotary tool.

9. The method of claim 1, wherein forming the periodic patterned material layer includes creating a pattern by selectively removing material from the uppermost material layer.

10. The method of claim 9, removing material from the periodic patterned material layer through openings in the mask layer.

11. The method of claim 10, wherein removing material includes mechanical, chemical, solvent, plasma etching or electroetching.

12. The method of claim 1, wherein the FSS structure further comprises nanoantennas.

13. The method of claim 1, wherein the FSS structure further comprises solar rectennas.

14. The method of claim 1, wherein the FSS structure further comprises ROTC.

15. The method of claim 1, wherein the FSS structure further comprises a protective layer.

16. The method of claim 1, wherein said polymer mask is formed by a transparent nanoimprint lithography tool.

* * * * *